US006720842B2

(12) United States Patent
Sawada

(10) Patent No.: US 6,720,842 B2
(45) Date of Patent: Apr. 13, 2004

(54) SURFACE ACOUSTIC WAVE FILTER DEVICE HAVING FIRST THROUGH THIRD SURFACE ACOUSTIC WAVE FILTER ELEMENTS

(75) Inventor: Yoichi Sawada, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/781,126

(22) Filed: Feb. 9, 2001

(65) Prior Publication Data

US 2001/0013815 A1 Aug. 16, 2001

(30) Foreign Application Priority Data

Feb. 14, 2000 (JP) ........................................ 2000-035299

(51) Int. Cl.[7] .............................. H03H 9/64; H03H 9/72
(52) U.S. Cl. ........................ 333/133; 333/193; 333/195
(58) Field of Search ................... 333/193–196

(56) References Cited

U.S. PATENT DOCUMENTS

| | | | | |
|---|---|---|---|---|
| 5,835,990 A | | 11/1998 | Saw et al. | ............... 310/313 D |
| 5,874,869 A | * | 2/1999 | Udea et al. | ................. 333/193 |
| 5,892,418 A | | 4/1999 | Onishi et al. | ............... 333/193 |
| 5,963,114 A | * | 10/1999 | Ueda et al. | ................. 333/195 |
| 5,966,061 A | * | 10/1999 | Tada | ......................... 333/195 |
| 5,994,980 A | * | 11/1999 | Tada | ......................... 333/193 |
| 6,081,172 A | * | 6/2000 | Strauss et al. | ............... 333/193 |

FOREIGN PATENT DOCUMENTS

| | | |
|---|---|---|
| DE | 198 18 038 A1 | 11/1999 |
| EP | 0 766 384 | 4/1997 |
| JP | 5-267990 | * 10/1993 |
| JP | 06-204781 | 7/1994 |
| JP | 8-65097 | * 3/1996 |
| JP | 08-265091 | 10/1996 |
| JP | 10-117123 | 5/1998 |
| JP | 11-97966 | 4/1999 |
| JP | 11-145772 | 5/1999 |
| WO | WO 98/12809 | 3/1998 |
| WO | WO 98/57428 | 12/1998 |
| WO | WO 00/25423 | 5/2000 |
| WO | WO 01/13514 A1 | 2/2001 |
| WO | WO 01/69782 A1 | 9/2001 |

OTHER PUBLICATIONS

G. Endoh et al.; "High Performance Balanced Type SAW Filters in the Range of 900MHz and 1.9GHz"; 1997 IEEE Ultrasonic Symposium; Aug. 1997; pp. 41–44.

H. Meier et al.; "Miniaturization and Advanced Functionalities of SAW Devices"; IEEE Transactions on Microwave Theory and Techniques; a publication of the IEEE Microwave Theory and Techniques Society; Part II of two parts; vol. 49, No. 4; Apr. 2001; pp. 743–748.

* cited by examiner

Primary Examiner—Barbara Summons
(74) Attorney, Agent, or Firm—Keating & Bennett, LLP

(57) ABSTRACT

A surface acoustic wave filter device includes a piezoelectric substrate, and first, second and third surface acoustic wave filter elements disposed on the piezoelectric substrate. Each of the surface acoustic wave filters has a plurality of IDTs disposed along the surface acoustic wave propagation direction. The second and third surface acoustic wave filter elements are arranged such that they are substantially equal in transmission amplitude characteristic within a band but different in transmission phase characteristic by about 180°. At least one IDT of the second surface acoustic wave filter element and at least one IDT of the third surface acoustic wave filter element are connected to at least one IDT of the first surface acoustic wave filter element.

18 Claims, 25 Drawing Sheets

DIFFERENCE IN SPACE BETWEEN ADJACENT IDTS IN THE SECOND AND THIRD SURFACE ACOUSTIC WAVE FILER ELEMENTS (NORMALIZED TO $\lambda$)

DIFFERENCE IN SPACE BETWEEN ADJACENT IDTS IN THE SECOND AND THIRD SURFACE ACOUSTIC WAVE FILER ELEMENTS (NORMALIZED TO $\lambda$)

SURFACE ACOUSTIC WAVE FILTER DEVICE HAVING FIRST THROUGH THIRD SURFACE ACOUSTIC WAVE FILTER ELEMENTS

BACKGROUND OF THE INVENTION

1. Field of the Invention

The present invention relates to a surface acoustic wave filter, and more particularly, to a surface acoustic wave filter having an impedance that is different between the input and output sides and which has an unbalance-to-balance conversion capability.

2. Description of the Related Art

In recent years, the size and the weight of portable telephones are becoming increasingly smaller. To this end, in addition to the reduction in the number of component parts and the reduction in the size thereof, development of components having a plurality of functions is being pursued.

In view of the above situation, research is being pursued to produce a surface acoustic wave filter having a balance-unbalance conversion capability called balun capability for use in the RF stage of portable telephones, and some surface acoustic wave filters are used mainly in GSM.

In portable telephones, a portion extending from an antenna to a bandpass filter is generally arranged in an unbalanced fashion and has a characteristic impedance of 50 Ω. On the other hand, amplifiers or other components following the filter are generally arranged in a balanced manner and have an impedance of 150 Ω to 200 Ω. In view of the above, it has been proposed to form a bandpass filter using a surface acoustic wave filter having a capability of converting 50 Ω unbalanced impedance to 150–200 Ω balanced impedance.

In a technique disclosed in Japanese Unexamined Patent Application Publication No. 10-117123, four surface acoustic wave filter elements are used to realize conversion from an unbalanced input to a balanced output. FIG. 28 shows the structure of the surface acoustic wave filter device disclosed in Japanese Unexamined Patent Application Publication No. 10-117123 cited above. In this surface acoustic wave filter device, a first surface acoustic wave filter unit 203 is constructed by cascading two surface acoustic wave filter elements 201 and 202, and a second surface acoustic wave filter unit 206 is defined by cascading a surface acoustic wave filter element 204 and a surface acoustic wave filter element 205 having a transmission phase characteristic that is different by about 180° from that of the surface acoustic wave filter element 204. The input/output terminals of the respective surface acoustic wave filter units 203 and 206 are connected in parallel or in series so that the parallel-connected terminals define unbalanced terminals and the series-connected terminals define balanced terminals.

FIG. 29 illustrates a surface acoustic wave filter device 211 having three IDTs, disclosed in Japanese Unexamined Patent Application Publication No. 6-204781. In this surface acoustic wave filter device 211, two output-side IDTs 212 and 213 are disposed on respective opposite sides such that phases become opposite to each other, and the output terminals of the respective IDTs 212 and 213 define balanced terminals. One end of an input-side IDT 214 disposed at a central location defines an unbalanced terminal. In this structure, the input impedance may be set to 50 Ω, and the output impedance may be set to 150–200 Ω.

In the surface acoustic wave filters having the balance-unbalance conversion capability, expansion of the passband is desired to meet the requirement of expansion of passbands in portable telephone systems. In surface acoustic wave filters having the balance-unbalance conversion capability, it is required that the transmission characteristics from the unbalanced terminal to the balanced terminals should be equal in amplitude but different by 180° in phase, over the passband. That is, an improvement in the degree of balance is desired.

However, in the surface acoustic wave filter device disclosed in Japanese Unexamined Patent Application Publication No. 10-117123, the expansion of the passband causes the impedance of the surface acoustic wave filter elements to become capacitive. This resultant capacitance and the parasitic capacitance present between the two cascaded stages cause an impedance mismatch between surface acoustic wave filter units. This makes it difficult to achieve expansion of the passband.

Furthermore, because as many as four surface acoustic wave filter elements are used, complicated interconnections are required, and the complicated interconnections result in an increase in parasitic capacitance which in turn results in degradation in the degree of balance. Furthermore, the use of the large number of surface acoustic wave filter elements results in an increase in size which makes it difficult to obtain a small device size. Furthermore, the use of the large number of surface acoustic wave filter elements results in a reduction in the number of surface acoustic wave filter devices obtained from each wafer, and thus results in an increase in cost.

On the other hand, in the surface acoustic wave filter device disclosed Japanese Unexamined Patent Application Publication No. 6-204781, the two IDTs 212 and 213 have different structures so as to achieve the balanced terminals, and the locations of the IDTs 116 and 117 with respect to the location of the central IDT 214 are different from each other. Such differences in structure or location often cause degradation in the degree of balance. Furthermore, the series connection of the IDTs 212 and 213 on the balanced terminal side results in an increase in loss due to the resistance of the electrode fingers, which results in an increase in insertion loss in the passband.

SUMMARY OF THE INVENTION

In order to overcome the problems described above, preferred embodiments of the present invention provide a surface acoustic wave filter device which has unbalanced/balanced input/output terminals and which has a wide passband and a high degree of balance.

In the surface acoustic wave filter device according to a first preferred embodiment, the second and third surface acoustic wave filter elements are arranged such that they are substantially equal in transmission amplitude characteristic within the band but different in transmission phase characteristic by about 180°, and at least one IDT of the second surface acoustic wave filter element and at least one IDT of the third surface acoustic wave filter element are connected to at least one IDT of the first surface acoustic wave filter element. Thus, the surface acoustic wave filter device can achieve the balance-unbalance conversion capability by using the electrode connected to the first surface acoustic wave filter element as an unbalanced terminal and using the terminals connected to respective second and third surface acoustic wave filter elements as balanced terminals. In this surface acoustic wave filter device according to the first preferred embodiment of the present invention, unlike the conventional surface acoustic wave filter device in which four surface acoustic wave filter elements are used, the balance-unbalance conversion capability is achieved using only three surface acoustic wave filter elements. As a result, reductions in the size and the cost of the surface acoustic wave filter device having the balance-unbalance conversion capability are achieved.

Furthermore, the reduction in the number of surface acoustic wave filter elements results in a reduction in parasitic capacitance, which suppresses degradation in the degree of balance and which makes is easy to expand the passband.

In the surface acoustic wave filter device according to a second preferred embodiment of the present invention, the second and third surface acoustic wave filter elements are arranged such that they are substantially equal in transmission amplitude characteristic within a band but different in transmission phase characteristic by about 180°, a second IDT of the first surface acoustic wave filter element is connected to the second surface acoustic wave filter element, and a third IDT of the first surface acoustic wave filter element is connected to an IDT of the third surface acoustic wave filter element. Thus, the surface acoustic wave filter device can achieve the balance-unbalance conversion capability by using the electrode connected to the first surface acoustic wave filter element as an unbalanced terminal and using the terminals connected to respective second and third surface acoustic wave filter elements as balanced terminals. In this surface acoustic wave filter device according to the second preferred embodiment of the present invention, unlike the conventional surface acoustic wave filter device in which four surface acoustic wave filter elements are used, the balance-unbalance conversion capability is achieved using only three surface acoustic wave filter elements. As a result, reductions in the size and the cost of the surface acoustic wave filter device having the balance-unbalance conversion capability are achieved.

Furthermore, the reduction in the number of surface acoustic wave filter elements results in a reduction in parasitic capacitance, which suppresses degradation in the degree of balance and which makes is easy to expand the passband.

In the surface acoustic wave filter device according to the second preferred embodiment of the present invention, if the first space and the second space are arranged such that they are different by an amount within the range from about 0.48 λ to about 0.525 λ, the amplitude balance becomes equal to or lower than about 1.5 dB and the phase balance becomes equal to or smaller than about 20°. As a result, it is ensured that degradation in the degree of balance is prevented.

If the first space and the second space are arranged so as to satisfy Equations 1 and 2, respectively, a sufficiently large bandwidth can be obtained, and degradation in the degree of balance is minimized.

Furthermore, in the surface acoustic wave filter device according to the second preferred embodiment of the present invention, if the first space and the second space are arranged so as to satisfy Equations 3 and 4, respectively, a sufficiently large bandwidth can be obtained and degradation in the degree of balance is minimized, even when a variation in frequency due to a temperature variation is taken into account.

If the first space is within the range from about 1.72 λ to about 1.83 λ and the second space is within the range from about 2.22 λ to about 2.33λ, the degradation in the degree of balance can be further suppressed and a sufficiently wide bandwidth can be achieved.

In the surface acoustic wave filter device according to the second preferred embodiment of the present invention, if a LiTaO₃ substrate made of a LiTaO₃ single crystal with an orientation rotated about the X axis from the Y axis to the Z axis within the range from about 36° to about 44° is used, and if at least one electrode finger is inserted in at least one of the first and second spaces so that the electrode covering ratio of the space in which the electrode finger is inserted becomes equal to or greater than about 50%, propagation of leaky waves becomes dominant, and thus a reduction in the insertion loss is achieved. In particular, if the electrode covering ratio is equal to or greater than about 63%, a further reduction in the insertion loss can be achieved.

In the surface acoustic wave filter device according to the second preferred embodiment of the present invention, if the distance between the first reflector and the second reflector is substantially equal to the distance between the third reflector and the fourth reflector, the filter characteristics of the second and third surface acoustic wave filter elements become substantially equal to each other, and thus, a further suppression in the degradation in the degree of balance is achieved.

The surface acoustic wave filter device according to a third preferred embodiment includes the first, second and third surface acoustic wave filter elements, wherein the second surface acoustic wave filter element is connected to the second IDT of the first surface acoustic wave filter element, the third surface acoustic wave filter element is connected to the third IDT of the first surface acoustic wave filter element, and there is a phase difference of about 180° within a passband between the inputs or the outputs of the second IDT and the third IDT of the first surface acoustic wave filter element. Thus, the surface acoustic wave filter device can have the balance-unbalance conversion capability by using the electrode connected to the first surface acoustic wave filter element as an unbalanced terminal and using the terminals connected to respective second and third surface acoustic wave filter elements as balanced terminals. In this surface acoustic wave filter device according to the first preferred embodiment of the present invention, unlike the conventional surface acoustic wave filter device in which four surface acoustic wave filter elements are used, the balance-unbalance conversion capability is achieved using only three surface acoustic wave filter elements. As a result, reductions in the size and the cost of the surface acoustic wave filter device having the balance-unbalance conversion capability are achieved.

Furthermore, the reduction in the number of surface acoustic wave filter elements results in a reduction in parasitic capacitance, which suppresses degradation in the degree of balance and which makes is easy to expand the passband.

In the surface acoustic wave filter device according to the third preferred embodiment of the present invention, if the first space and the second space are arranged such that they are different by an amount within the range from about 0.48 λ to about 0.525 λ, the amplitude balance becomes equal to or lower than about 1.5 dB and the phase balance becomes equal to or smaller than about 20°. That is, it is ensured that degradation in the degree of balance is prevented.

In the surface acoustic wave filter device according to the third preferred embodiment of the present invention, if the first space and the second space are arranged so as to satisfy Equations 1 and 2, respectively, a sufficiently large bandwidth can be obtained, and degradation in the degree of balance is minimized.

Furthermore, in the third preferred embodiment of the present invention, if the first space and the second space are arranged so as to satisfy Equations 3 and 4, respectively, a sufficiently large bandwidth can be obtained and degradation in the degree of balance is minimized, even when a variation in frequency due to a temperature variation is taken into account.

If the first space is within the range from about 1.72 λ to about 1.88 λ and the second space is set within the range from about 2.22 λ to about 2.33 λ, the degradation in the degree of balance can be further suppressed and a sufficiently wide bandwidth can be achieved.

In the surface acoustic wave filter device according to the third preferred embodiment of the present invention, if the distance between the center of the first IDT and the first reflector and the distance between the center of the first IDT and the second reflector are set to be substantially equal to each other, a further suppression in the degradation in the degree of balance is achieved.

In the surface acoustic wave filter device according to one of the first to third preferred embodiments, if the interdigital overlapping length of the electrode finger of the IDTs defining the first surface acoustic wave filter element is within the range of about 1.5 to about 3.5 times the interdigital overlapping length of the electrode finger of the IDTs defining the second and third surface acoustic wave filter element, degradation in VSWR in the passband is suppressed.

In the surface acoustic wave filter device according to a fourth preferred embodiment of the present invention, the second surface acoustic wave filter element is arranged such that the transmission amplitude characteristic of the second surface acoustic wave filter element is substantially equal to that of the first surface acoustic wave filter element and such that the transmission phase characteristic of the second surface acoustic wave filter element is different by about 180° from that of the first surface acoustic wave filter element, and one end of each of the first and second surface acoustic wave filter elements is electrically connected in parallel, and the other end of each of the first and second surface acoustic wave filter elements is electrically connected in series, so that the parallel-connected terminals form unbalanced terminals and the series-connected terminals define balanced terminals. Thus, a balance-unbalance conversion capability is achieved, as in the surface acoustic wave filter device according to the first to third preferred embodiments. Furthermore, because only two surface acoustic wave filter elements are used, further reductions in the size and cost can be achieved.

In the surface acoustic wave filter element according to the fourth preferred embodiment, if the first space and the second space are arranged such that they are different by an amount within the range from about 0.48 λ to about 0.525 λ, the amplitude balance becomes equal to or lower than about 1.5 dB and the phase balance becomes equal to or smaller than about 20°. That is, it is ensured that degradation in the degree of balance is prevented.

In the surface acoustic wave filter device according to the fourth preferred embodiment of the present invention, if the first space and the second space are arranged so as to satisfy Equations 1 and 2, respectively, a sufficiently large bandwidth can be obtained, and degradation in the degree of balance is minimized.

Furthermore, if the first space and the second space are arranged so as to satisfy Equations 3 and 4, respectively, a sufficiently large bandwidth can be obtained and degradation in the degree of balance is minimized, even when a variation in frequency due to a temperature variation is taken into account.

In the fourth preferred embodiment, if the first space is within the range from about 1.72 λ to about 1.88 λ and the second space is within the range from about 2.22 λ to about 2.33 λ, the degradation in the degree of balance can be further suppressed and a sufficiently wide bandwidth can be achieved.

Also in the fourth preferred embodiment of the present invention, if a $LiTaO_3$ substrate made of a $LiTaO_3$ single crystal with an orientation rotated about the X axis from the Y axis to the Z axis within the range from about 36° to about 44° is used, and if at least one electrode finger is inserted in at least one of the first and second spaces so that the electrode covering ratio of the space in which the electrode finger is inserted becomes equal to or greater than approximately 50%, propagation of leaky waves becomes dominant, and thus a reduction in the insertion loss is achieved. In particular, if the electrode covering ratio is equal to or greater than about 63%, a further reduction in the insertion loss can be achieved.

In the surface acoustic wave filter device according to the fourth preferred embodiment of the present invention, if the distance between the first reflector and the second reflector is substantially equal to the distance between the third reflector and the fourth reflector, the filter characteristics of the second and third surface acoustic wave filter elements become substantially equal to each other, and thus a further suppression in the degradation in the degree of balance is assured.

In the surface acoustic wave filter device according to the fourth preferred embodiment of the present invention, if the unbalanced-side terminal of the first surface acoustic wave filter element and the unbalanced-side terminal of the second surface acoustic wave filter element are connected to each other via an electrode pattern on the piezoelectric substrate, a reduction in parasitic capacitance is achieved, and thus a further reduction in the insertion loss is achieved.

In a fifth preferred embodiment of the present invention, the surface acoustic wave filter device includes first to third surface acoustic wave filter elements, the first and second spaces are arranged so as to satisfy Equation 1 and 2, respectively, the first IDT defines the unbalanced terminal, and the second and third IDTs are electrically connected in series so as to define the unbalanced terminal. Thus, the surface acoustic wave filter device can have the balance-unbalance conversion capability by using the electrode connected to the first surface acoustic wave filter element as an unbalanced terminal and using the terminals connected to respective second and third surface acoustic wave filter elements as balanced terminals. In this surface acoustic wave filter device according to the fifth preferred embodiment, unlike the conventional surface acoustic wave filter device in which four surface acoustic wave filter elements are used, the balance-unbalance conversion capability is achieved using only three surface acoustic wave filter elements. As a result, reductions in the size and the cost of the surface acoustic wave filter device having the balance-unbalance conversion capability are achieved.

Furthermore, the reduction in the number of surface acoustic wave filter elements results in a reduction in parasitic capacitance, which suppresses degradation in the degree of balance and which makes it easy to expand the passband.

Similarly, also in the surface acoustic wave filter device according to a sixth or seventh preferred embodiment, the surface acoustic wave filter device can have the balance-unbalance conversion capability by using the electrode connected to the first surface acoustic wave filter element as an unbalanced terminal and using the terminals connected to respective second and third surface acoustic wave filter elements as balanced terminals. In this surface acoustic wave filter device according to the first through sixth preferred embodiments, unlike the conventional surface acoustic wave filter device in which four surface acoustic wave filter elements are used, the balance-unbalance conversion capability is achieved using only three surface acoustic wave filter elements. As a result, reductions in the size and the cost of the surface acoustic wave filter device having the balance-unbalance conversion capability are achieved.

Furthermore, the reduction in the number of surface acoustic wave filter elements results in a reduction in parasitic capacitance, which minimizes degradation in the degree of balance and which makes is easy to expand the passband.

The surface acoustic wave filter device according to an eighth preferred embodiment also has the balance-unbalance conversion capability as in the first preferred embodiment. Furthermore, because the particular type of piezoelectric substrate is used as the piezoelectric substrate, propagation of leaky waves becomes dominant, and thus a reduction in the insertion loss is achieved. In particular, if the electrode covering ratio is equal to or greater than about 63%, a further reduction in the insertion loss is achieved. Furthermore, the first and second spaces are arranged so as to be different from each other by about 0.48 λ to about 0.525 λ so that the amplitude balance equal to or less than about 1.5 dB and the phase balance equal to or smaller than about 20° can be achieved. Thus, degradation in the degree of balance is prevented. At least one electrode finger is disposed in each area between an electrode finger, which is one of the first IDT's electrode fingers connected to a signal line and which is disposed at an outermost location, and an electrode finger which is one of the second or third IDT's electrode fingers connected to a signal line and which is disposed at a location closest to the center, so that the electrode covering ratio in each area descried above becomes equal to or greater than about 50% thereby achieving a further reduction in the insertion loss.

In particular, if the electrode covering ratio is equal to or greater than about 63%, a further reduction in the insertion loss can be achieved.

In the present preferred embodiment, when a series terminal is connected on the unbalanced terminal side, the characteristic in terms of attenuation outside the passband is greatly improved.

Similarly, if surface acoustic wave resonators are connected in series to the respective terminals on the balanced terminal side, the characteristic in terms of attenuation outside the passband is greatly improved.

In the case where a surface acoustic wave filter in the form of a cascaded ladder circuit is disposed on the balanced terminal side, if the ladder-type surface acoustic wave filter is arranged such that its attenuation poles are located near the lower and upper edges of the passband, greater attenuation and better selectivity can be achieved. Furthermore, the surface acoustic wave resonator connected in parallel between the balanced terminals imposes equal influences upon both balanced terminals. This makes it possible to increase the attenuation outside the passband without causing degradation in the degree of balance.

In the surface acoustic wave filter device according to the present preferred embodiment, in the case where a chip on which surface acoustic wave filter elements are disposed is housed in a package, if at least one of the electrode pattern, the package, and the electrical connection member has a structure which are substantially axially symmetric, further suppression in degradation in the degree of balance can be achieved.

In particular, when at least two of the electrode pattern, the package, and the electrical connection member have structures which are substantially axially symmetric with respect to the same symmetry axis, further suppression in degradation in the degree of balance can be achieved.

The surface acoustic wave filter according to various preferred embodiments of the present embodiment can be used in duplexers or communication devices, as described above. In this case, a reduction in the size of the duplexers and communication devices can be achieved.

For the purpose of illustrating the invention, there is shown in the drawings several forms which are presently preferred, it being understood, however, that the present invention is not limited to the precise arrangements and instrumentalities shown.

Other features, elements, characteristics and advantages of the present invention will become apparent from the detailed description of preferred embodiments thereof with reference to the attached drawings.

DETAILED DESCRIPTION OF PREFERRED EMBODIMENTS

The present invention is described in further detail below with reference to specific preferred embodiments of surface acoustic wave filter devices in conjunction with the drawings.

Figure 1:
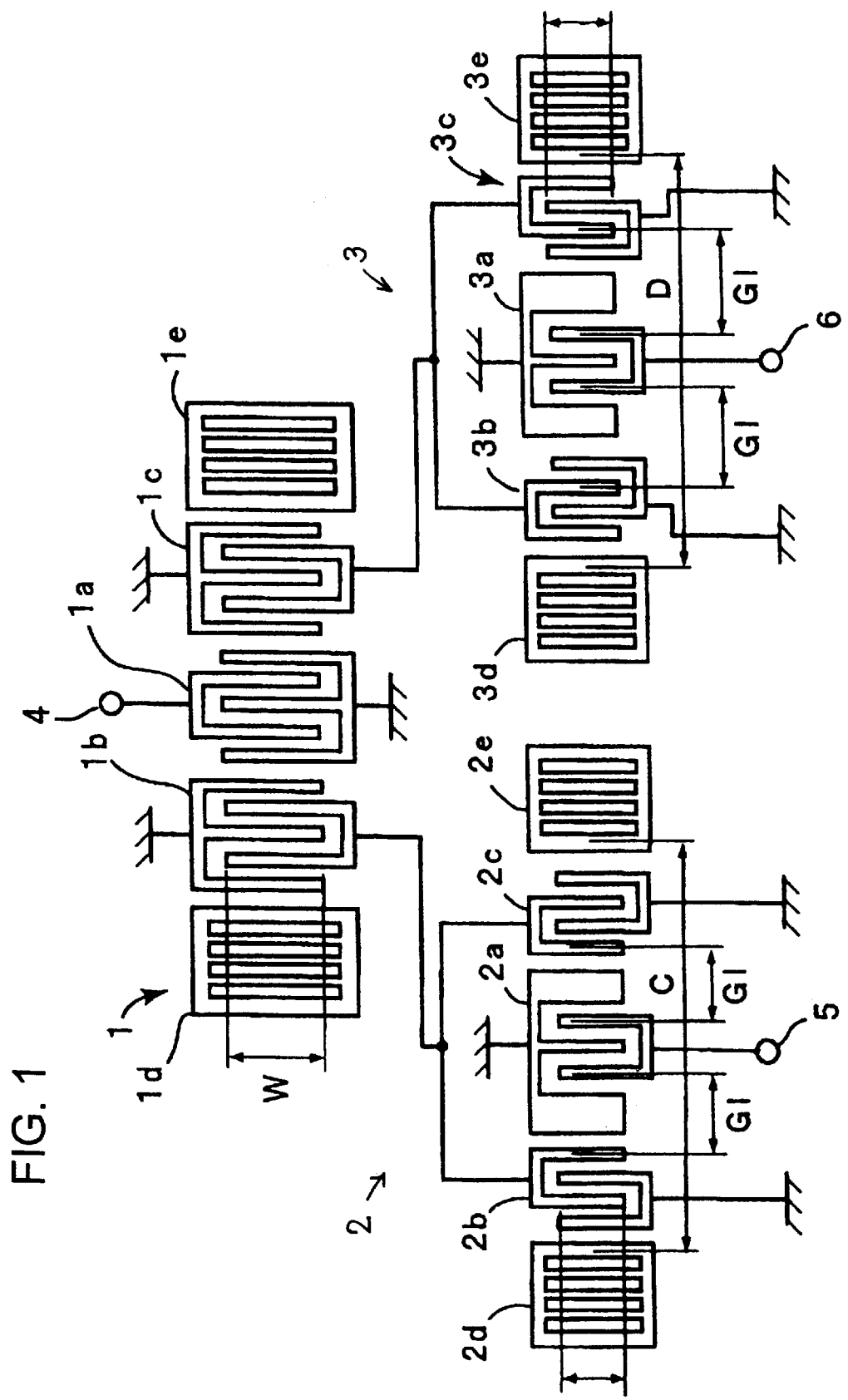
FIG. 1 is a plan view schematically illustrating the electrode structure of a surface acoustic wave filter device according to a first preferred embodiment of the present invention.

Referring to FIG. 1, a first preferred embodiment of a surface acoustic wave filter device according to the present invention is described below.

FIG. 1 is a plan view illustrating the electrode structure of the first preferred embodiment of the surface acoustic wave filter device. In the present preferred embodiment of the surface acoustic wave filter device, three surface acoustic wave filter elements 1 to 3 are disposed on a piezoelectric substrate. A substrate made of a proper piezoelectric material such as $LiTaO_3$ or quartz is preferably used as the piezoelectric substrate. In this preferred embodiment, a 36° Y-X $LiTaO_3$ substrate is preferably used.

The first surface acoustic wave filter element 1 has three IDTs 1a to 1c disposed along the surface wave propagation direction. In the area where the IDTs 1a to 1c are disposed, grating-type reflectors 1d and 1e are disposed at respective ends in the surface wave propagation direction.

Similarly, the second and third surface acoustic wave filter elements 2 and 3 have a structure in which three IDTs 2a to 2c or 3a to 3c are arranged in the surface wave propagation direction. Also, in the second and third surface acoustic wave filter elements 2 and 3, grating-type reflectors 2d, 2e, 3d, and 3e are disposed at respective ends, in the surface wave propagation direction, outside the areas where the IDTs 2a to 2c and 3a to 3c are disposed. Each IDT 1a to 1c, 2a to 2c, and 3a to 3c has a pair of comb-shaped electrodes.

One comb-shaped electrode of the central IDT 1a of the first surface acoustic wave filter element 1 is connected to an input terminal 4. One comb-shaped electrode of each of the second and third IDTs 1b located outside of the first IDT 1a at the central location is electrically connected to one of the comb-shaped electrodes of each of the second and third IDTs 2b and 2c disposed at outer locations in the second surface acoustic wave filter element. Similarly, one of comb-shaped electrodes of the IDT 1c at an outer location in the first surface acoustic wave filter element is electrically connected to one of comb-shaped electrodes of each of the IDTs 3b and 3c at outer locations in the third surface acoustic wave filter element 3. One of comb-shaped electrodes of each IDTs 2a and 3a at the central location in each of the second and third surface acoustic wave filter elements is electrically connected to an output terminal 5 or 6. The other comb-shaped electrode of each of the IDTs 1a to 1c, 2a to 2c, and 3a to 3c is grounded.

The input terminal 4 is an unbalanced terminal, and the output terminals 5 and 6 are balanced terminals.

The transmission phase characteristic of the third surface acoustic wave filter element 103 is different by about 180° from the transmission phase characteristic of the second surface acoustic wave filter element 102.

Specific examples of the structures of the first to third surface acoustic wave filter elements 1 to 3 are described below.

In the present preferred embodiment, IDTs 1a to 1c in the first surface acoustic wave filter element 1 have an interdigital overlapping length W of the electrode finger substantially equal to 52 λ where λ is the wavelength of the surface acoustic wave. The first IDT 1a disposed at the central location has 16 pairs of electrode fingers, and the IDTs disposed at outer locations, that is, the second and third IDTs 1b and 1c each have 11 pairs of electrode fingers. In the IDTs 1a to 1c, the wavelength $\lambda I$ of the surface acoustic wave is substantially equal to about 4.2 $\mu$m. The reflectors 1d and 1e each have 120 electrode fingers, and the wavelength $\lambda R$ is substantially equal to about 4.3 $\mu$m. The space GI between adjacent IDTs 1a to 1c is substantially equal to about 1.77 $\lambda R$. Herein, the space between adjacent IDTs is defined as follows. For example, the space between IDTs 1a and 1b is defined as the pitch between hot electrode fingers which belong to the respective IDTs 1a and 1b and which are closest to each other.

In the second surface acoustic wave filter element 2, the interdigitally overlapping lengths W of the electrode finger of the IDTs 2a to 2c are substantially equal to about 31 $\lambda$. The first IDT 2a disposed at the approximately central location has 16 pairs of electrode fingers, and the IDTs disposed at outer locations, that is, the second and third IDTs 2b and 2c each have 11 pairs of electrode fingers. In the IDTs 2a to 2c, the wavelength $\lambda I$ of the surface acoustic wave is substantially equal to about 4.2 $\mu$m. The reflectors 2d and 2e each have 120 electrode fingers, and the wavelength $\lambda$ is substantially equal to about 4.3 $\mu$m. The space GI between adjacent IDTs 2a to 2c is substantially equal to about 1.77 $\lambda R$.

The third surface acoustic wave filter element 3 is constructed in the same manner as the second surface acoustic wave filter element 2 except that the space GI between adjacent IDTs is substantially equal to about 2.27 $\lambda R$.

The space GI between adjacent IDTs is preferably different for the second surface acoustic wave filter element 2 and the third surface acoustic wave filter element 3 so that the transmission phase characteristic becomes different by about 180°. Note that the manner of creating a difference of 180° in the transmission phase characteristic between the second and third surface acoustic wave filter elements 2 and 3 is not limited to setting the space between adjacent IDTs to different values.

In the present preferred embodiment, and also in the following preferred embodiments of the present invention, the surface acoustic wave filter elements and the reflectors have a great number of electrode fingers, and thus they are represented in simplified fashions in the figures.

The operation of the surface wave acoustic filter element of the present preferred embodiment is described below for the case where the input terminal 4 is used as an unbalanced input terminal and the output terminals 5 and 6 are used as balanced output terminals.

When an electrical signal is applied to the input terminal 4, the electrical signal is filtered by the first surface acoustic wave filter element 1, and the resultant electrical signal is applied to the second and third surface acoustic wave filter elements 2 and 3. Herein, if the IDTs 1b and 1c in the surface acoustic wave filter element 1 have the same structure and if the distance from the IDT 1a to the IDT 1b and that from the IDT 1a to the IDT 1c are substantially equal to each other, the same electrical signal is applied to the second and third surface acoustic wave filter elements 2 and 3.

The electrical signals applied to the surface acoustic wave filter element 2 and that applied to the surface acoustic wave filter element 3 are again filtered and supplied to the balanced output terminals 5 and 6.

As described above, the surface acoustic wave filter element 2 and the surface acoustic wave filter element 3 are constructed in the same manner except for the difference in the space GI between adjacent IDTs. Therefore, in the filtering, the surface acoustic wave filter element 2 and the surface acoustic wave filter element 3 are the same in the amplitude characteristic but are different by about 180° in the transmission phase characteristic. As a result, the electrical signals supplied to the output terminals 5 and 6 are the same in the amplitude characteristic but are different by about 180° in the transmission phase characteristic, and thus the electrical signals supplied to the output terminals 5 and 6 become perfectly balanced signals.

The parameters such as an interdigital overlapping length of the surface acoustic wave filter element 1 are set such that the surface acoustic wave filter element 1 matches the characteristic impedance, for example, 50 $\Omega$, of an unbalanced circuit such as an antenna circuit connected to the input terminal 4. The parameters such as an interdigital overlapping length of the surface acoustic wave filter elements 2 and 3 are set so as to match one-half the characteristic impedance of 150 $\Omega$ of an balanced circuit such as an amplifier connected to the output terminals 5 and 6. Note that when each of the terminals 5 and 6 of the balanced circuit is regarded as an unbalanced terminal, the characteristic impedance becomes substantially equal to one-half the characteristic impedance of the balanced circuit.

In the surface acoustic wave filter device having the balance-to-unbalance conversion capability disclosed in Japanese Unexamined Patent Application Publication No. 10-117123 cited above, two surface acoustic wave filter elements are required to be disposed on the input side (unbalanced side).

In contrast, in the present preferred embodiment, only one surface acoustic wave filter element is required to be disposed on the input side (unbalance side) as described above. Therefore, compared with the prior art described above, the present preferred embodiment allows great reductions in the parasitic capacitance between bus bars of adjacent IDTs, the parasitic capacitance associated with interconnection lines between the surface acoustic wave filter element on the input side and surface acoustic wave filter elements on the output side, the parasitic capacitance associated with electrodes extending on a chip between package electrodes and the surface acoustic wave filter device, and the parasitic capacitance associated with bonding pads. The parasitic capacitances such as those described above are major factors which make it difficult to increase the bandwidth of surface acoustic wave filter devices.

In the surface acoustic wave filter device according to the present preferred embodiment, it is possible to reduce the parasitic resistances as described above, and thus it is possible to achieve a wideband filter characteristic without causing degradation in the flatness or VSWR in the passband.

Figure 2:
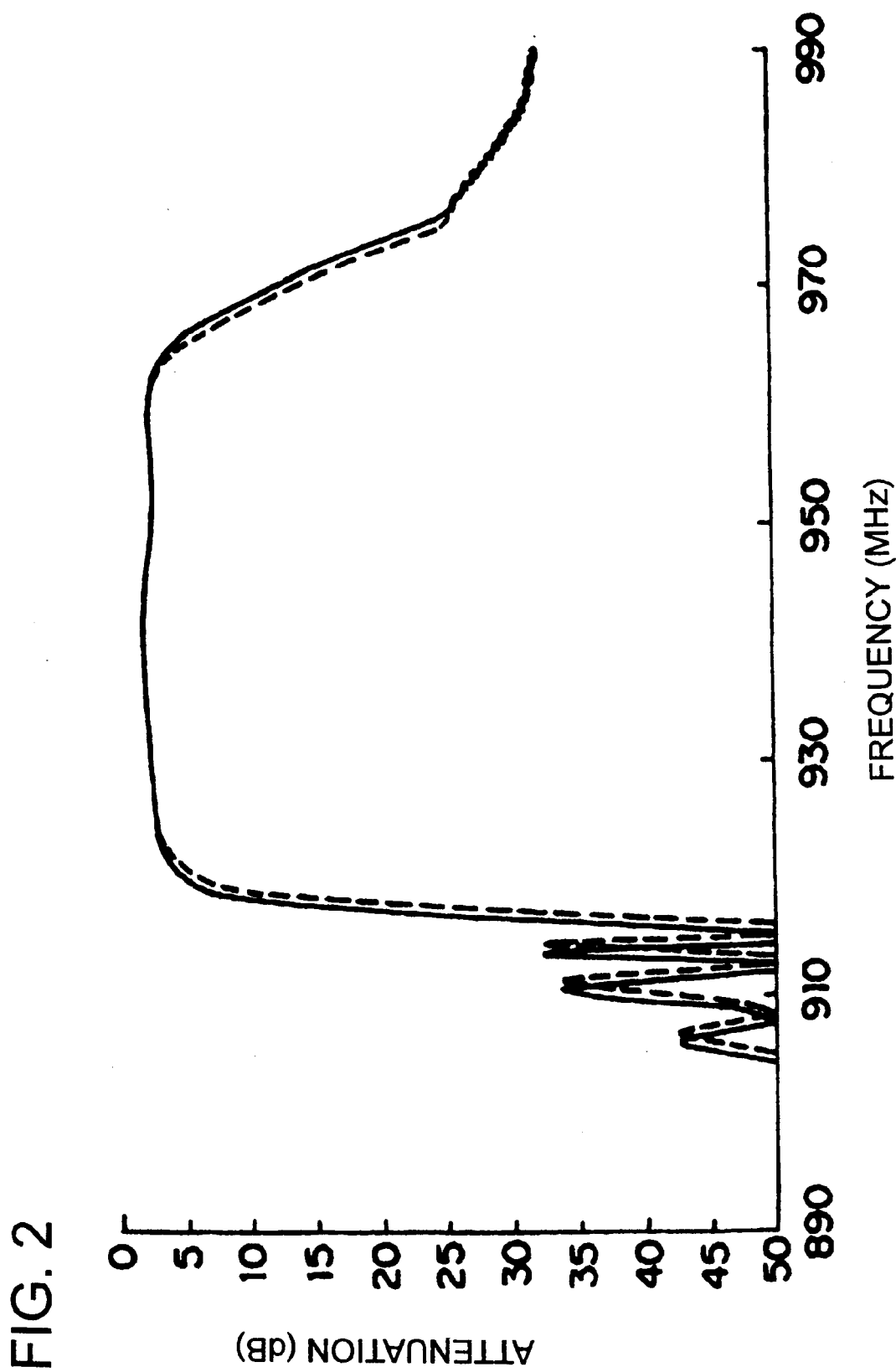
FIG. 2 is graph illustrating the filter characteristic of the surface acoustic wave filter device according to the first preferred embodiment of the present invention and also illustrates the filter characteristic of a conventional surface acoustic wave filter device.

The filter characteristic obtained in the present preferred embodiment is represented by a solid line in FIG. 2. For the purpose of comparison, the filter characteristic of a surface acoustic wave filter device, which has been produced in accordance with the description in Japanese Unexamined Patent Application Publication No. 10-117123 so as to have a similar passband to that of the surface acoustic wave filter device according to the present preferred embodiment, is represented by a broken line.

As can be seen from FIG. 2, the present preferred embodiment allows the surface acoustic wave filter device to have a wideband filter characteristic.

Figure 3:
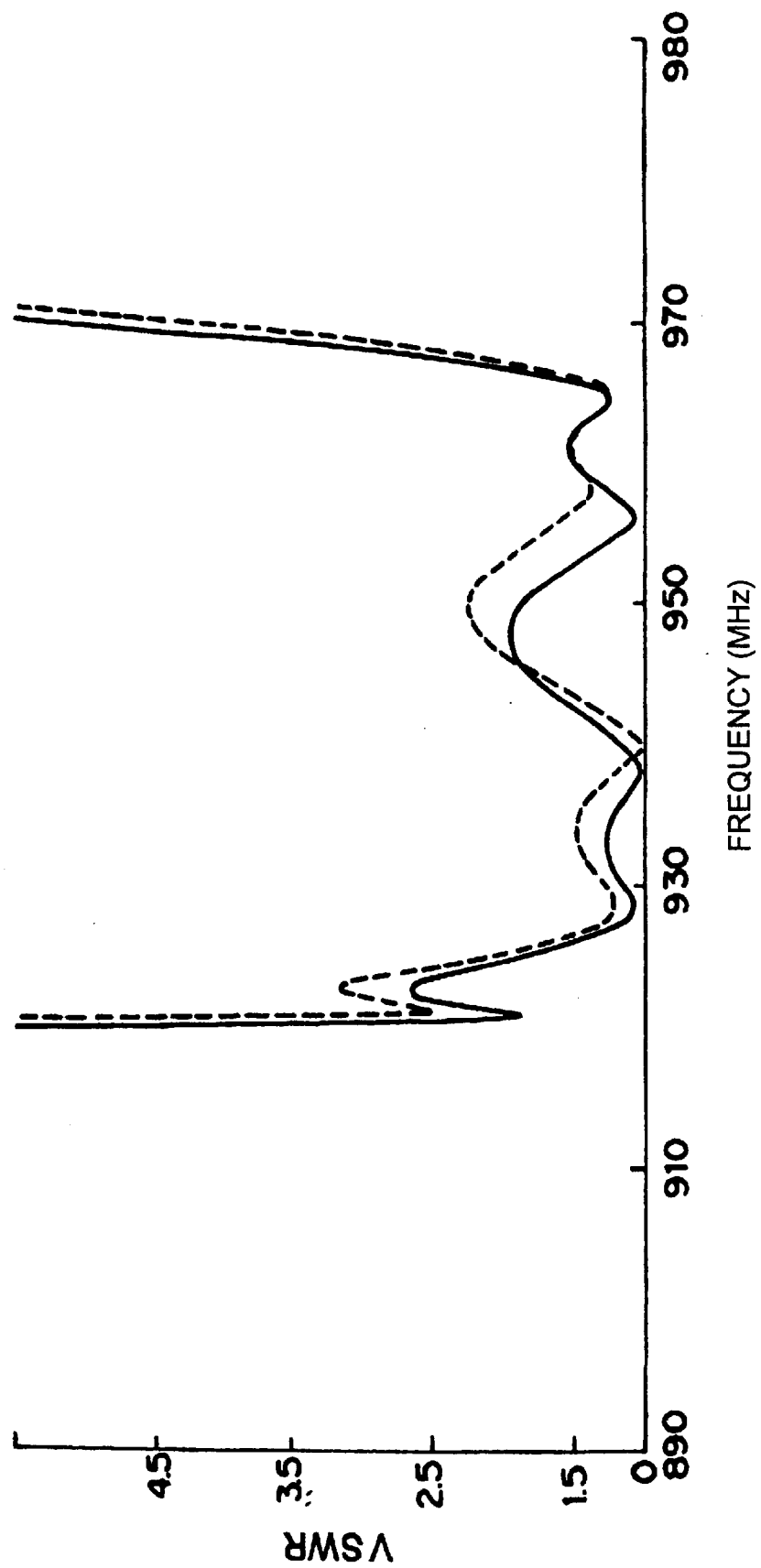
FIG. 3 is a graph illustrating VSWR at an unbalanced terminal for both the surface acoustic wave filter device according to the first preferred embodiment of the present invention and the conventional surface acoustic wave filter device.
Figure 4:
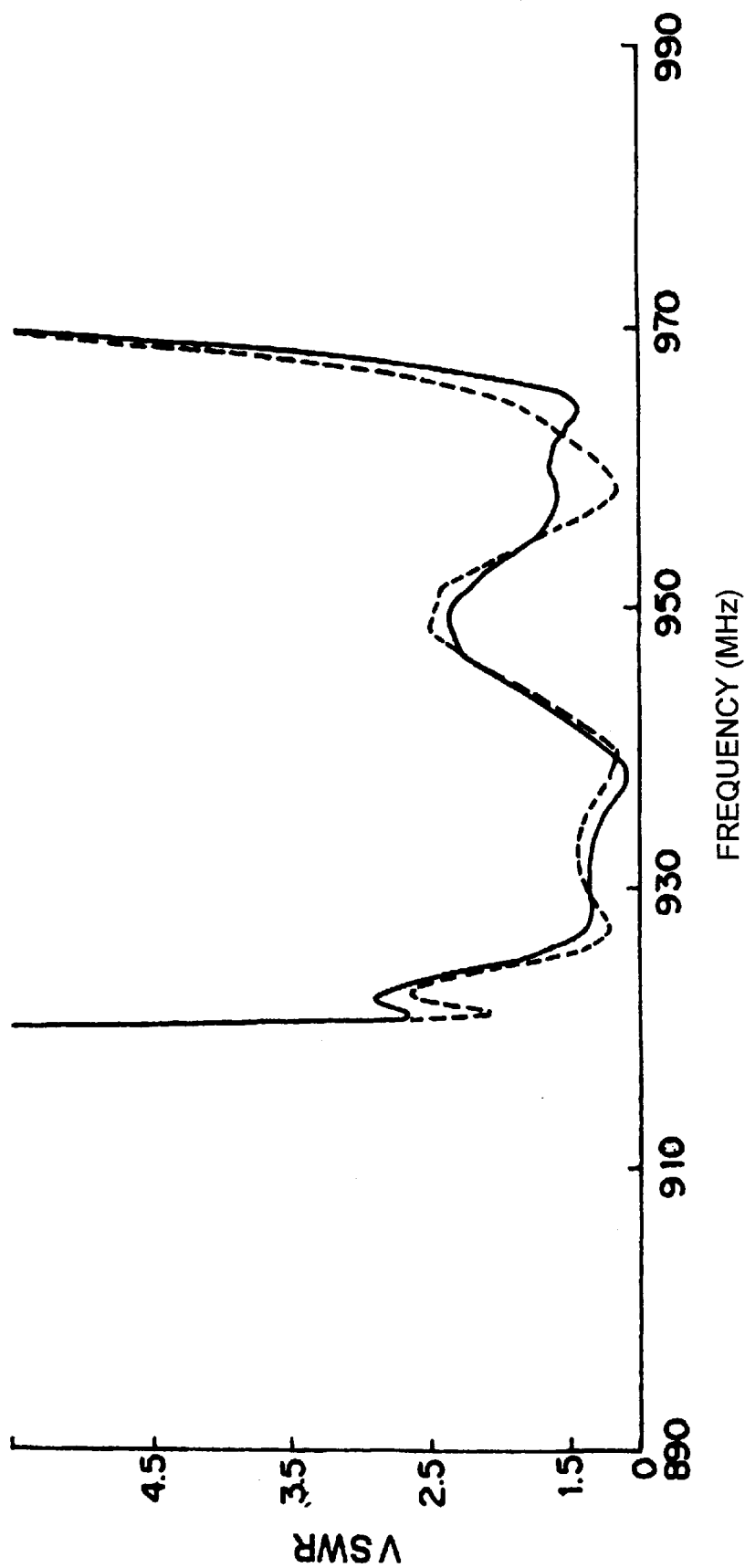
FIG. 4 is a graph illustrating VSWR at balanced terminals for both the surface acoustic wave filter device according to the first preferred embodiment of the present invention and the conventional surface acoustic wave filter device.

FIGS. 3 and 4 show the VSWR characteristic at the unbalanced and balanced terminals of the surface acoustic wave filter devices produced in accordance with the present preferred embodiment and the prior art described above. In these figures, solid lines represent the characteristic of the surface acoustic wave filter device according to the present preferred embodiment, and the broken lines represent the characteristic of the surface acoustic wave filter device according to the prior art. As can be seen from FIGS. 3 and 4, the present preferred embodiment greatly suppresses degradation in VSWR.

Furthermore, the surface acoustic wave filter device according to the present preferred embodiment needs only three surface acoustic wave filter elements, and thus it is possible to reduce the chip size. This allows a reduction in the total size of the surface acoustic wave filter device and makes it possible to obtain a greater number of surface acoustic wave filter devices from each wafer in production of surface acoustic wave filter devices, and thus a reduction in cost can be achieved.

Figure 5:
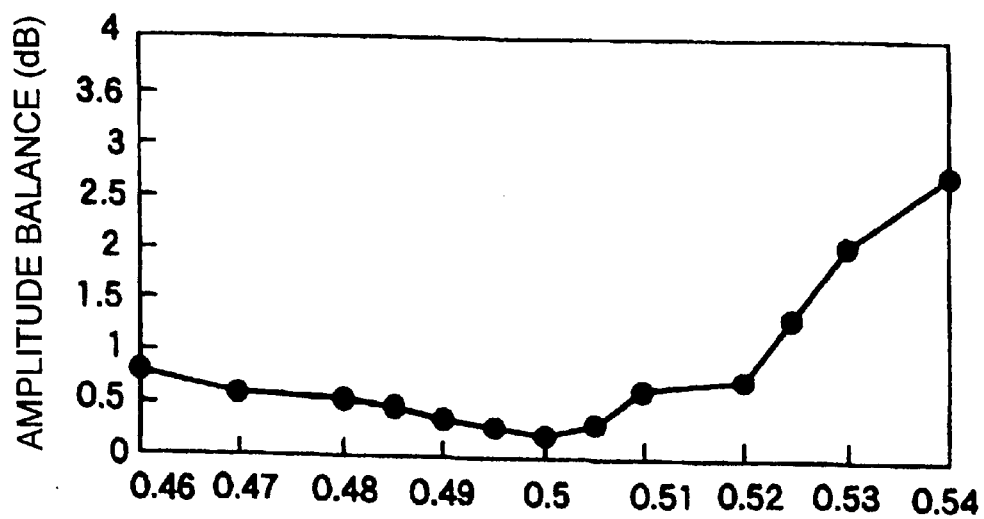
FIG. 5 is a graph illustrating the dependence of the amplitude balance upon the space between adjacent IDTs.
Figure 6:
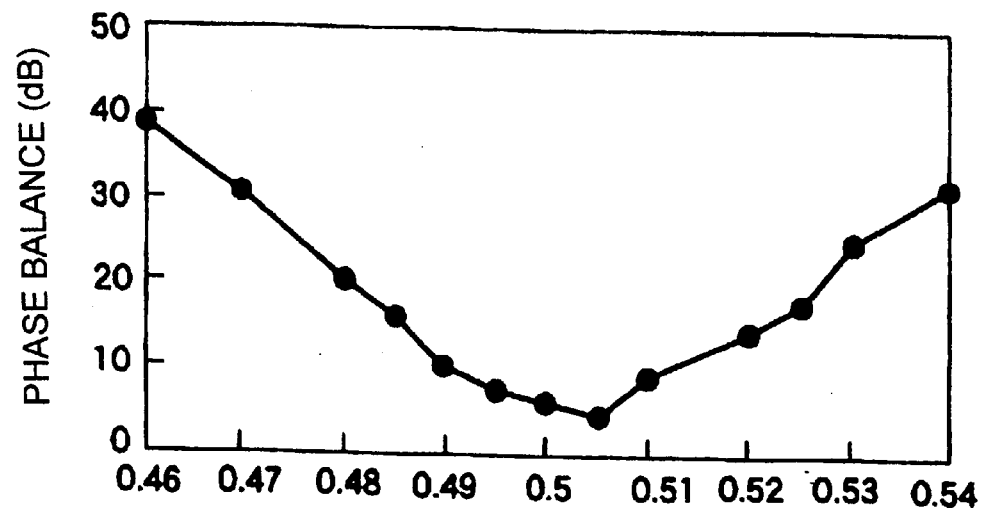
FIG. 6 is a graph illustrating the dependence of the phase balance upon the space between adjacent IDTs.

FIGS. 5 and 6 show the degree of balance as a function of the difference, in terms of the space between adjacent IDTs, between the surface acoustic wave filter elements 2 and 3 for the case where the space GI between the adjacent IDTs of the second surface acoustic wave filter element is preferably fixed at about 1.77 $\lambda$, and the space GI between the adjacent IDTs of the third surface acoustic wave filter element 3 is varied. Herein, the space between adjacent IDTs is defined as the distance from the center of an electrode finger, which is one of one IDT's electrode fingers, not grounded but connected to a signal line, and which is closest to the other IDT, to the center of an electrode finger which is one of the other IDT's electrode fingers, not grounded but connected to a signal line, and which is closest to the one IDT. Note that the space differences taken along the horizontal axes in FIGS. 5 and 6 are normalized to $\lambda$.

Herein, the amplitude balance and the phase balance are defined as follows. When the surface acoustic wave filter device of the present preferred embodiment is regarded as a 3-port device in which the unbalanced input terminal functions as a port 1 and the balanced output terminals 5 and 6 function as ports 2 and 3, respectively, the amplitude balance $|A|$ is given by $A=|21|-|S31|$, and the phase balance $|B-180|$ is given by $B=|<S21-<S31|$.

Ideally, the amplitude balance is 0 dB and the phase balance is 0°. However, the amplitude balance less than about 1.5 dB and the phase balance less than about 20° are allowed in practical use.

It can be seen from FIG. 5 that the amplitude balance falls within the allowable range if the IDT space difference between the surface acoustic wave filter elements 2 and 3 is smaller than about 0.525 $\lambda$. On the other hand, FIG. 6 indicates that the phase balance falls within the allowable range if the IDT space difference between the surface acoustic wave filter elements 2 and 3 is in the range from about 0.48 $\lambda$ to about 0.525 $\lambda$. Therefore, both the amplitude balance and the phase balance fall within the respective allowable ranges if the difference between the IDT space of the surface acoustic wave filter element 2 and the IDT space of the surface acoustic wave filter element 3 is within the range from about 0.48 $\lambda$ to about 0.525 $\lambda$.

In the case of a surface acoustic wave filter element of the cascade-coupled resonator type having three IDTs, it is known to achieve a wideband filter characteristic by setting the space between adjacent IDTs within the range from $(0.72+n/2)\times\lambda$ to $(0.83+n/2)\times\lambda$, where n=0, 1, 2, ..., 6. This means that there can be various different ranges within which the difference in IDT space between the surface acoustic wave filter element 2 and the surface acoustic wave filter element 3 should be taken.

Figure 7:
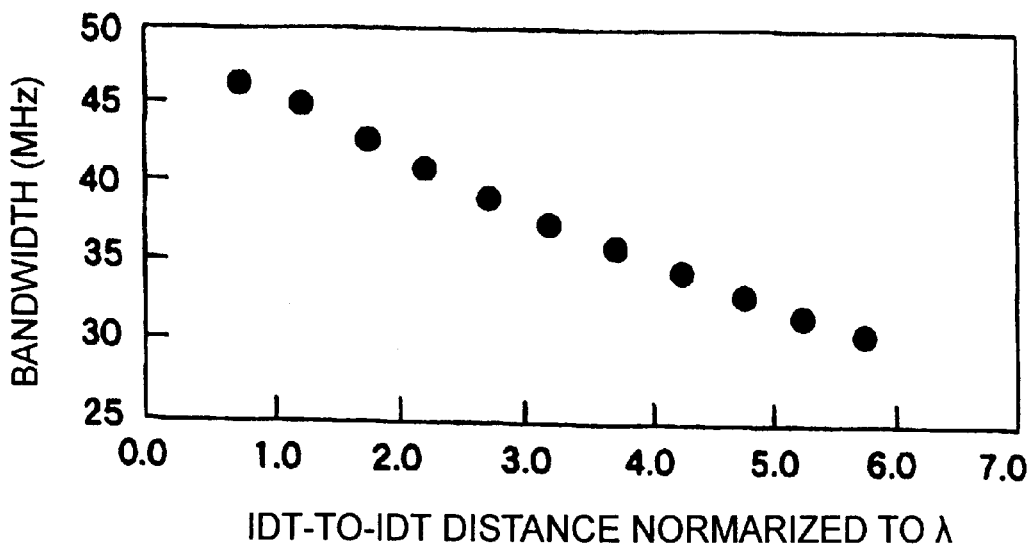
FIG. 7 is a graph illustrating the dependence of the bandwidth upon the space between adjacent IDTs.

However, if the value of n in the above formula is too great, the following problem occurs. FIG. 7 shows the dependence of the bandwidth of the surface acoustic wave filter device upon the space between adjacent IDTs for the case where the space between adjacent IDTs of the surface acoustic wave filter element 2 of the surface acoustic wave filter device according to the present preferred embodiment is substantially equal to $(n/2+0.77)+\lambda$ where n=0, 1, 2, ..., 6. As can be seen from FIG. 7, n should be equal to or smaller than 6 to meet the requirement that the bandwidth of surface acoustic wave filter devices for use in portable telephones should be equal to or greater than about 35 MHz.

Figure 9:
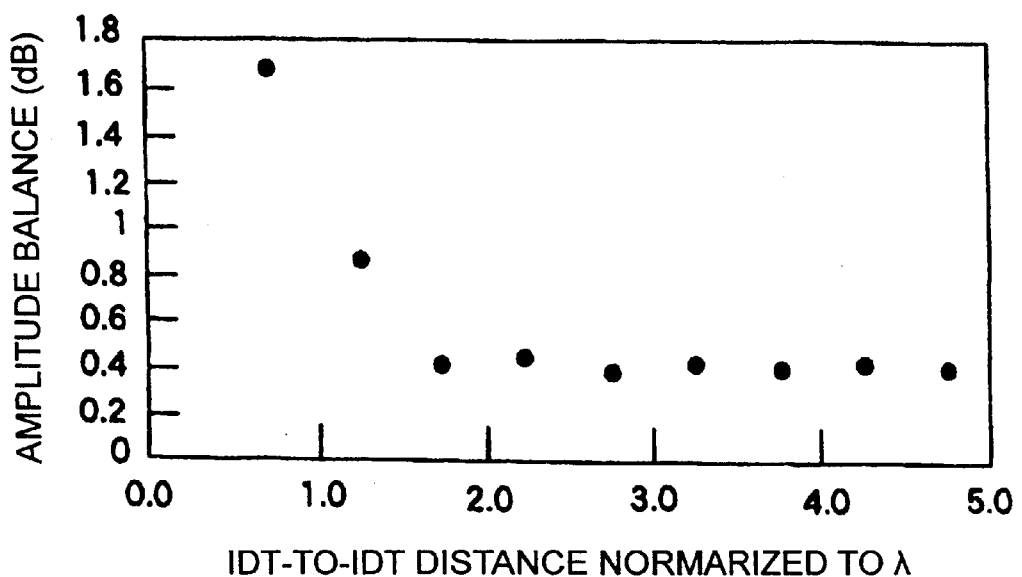
FIG. 9 is a graph illustrating the dependence of the amplitude balance upon the space between adjacent IDTs.

On the other hand, if n is too small, another problem occurs. FIG. 9 shows the dependence of the amplitude balance of the surface acoustic wave filter device of the present preferred embodiment upon the space GI between adjacent IDTs in the second surface acoustic wave filter element 2 for the case where the space GI between adjacent IDTs of the surface acoustic wave filter element 2 is substantially equal to $(0.77+m/2)\times\lambda$ and the space GI between adjacent IDTs of the surface acoustic wave filter element 3 is substantially equal to $(1.27+m/2)\times\lambda$ where m=0, 1, 2, ...

Figure 10:
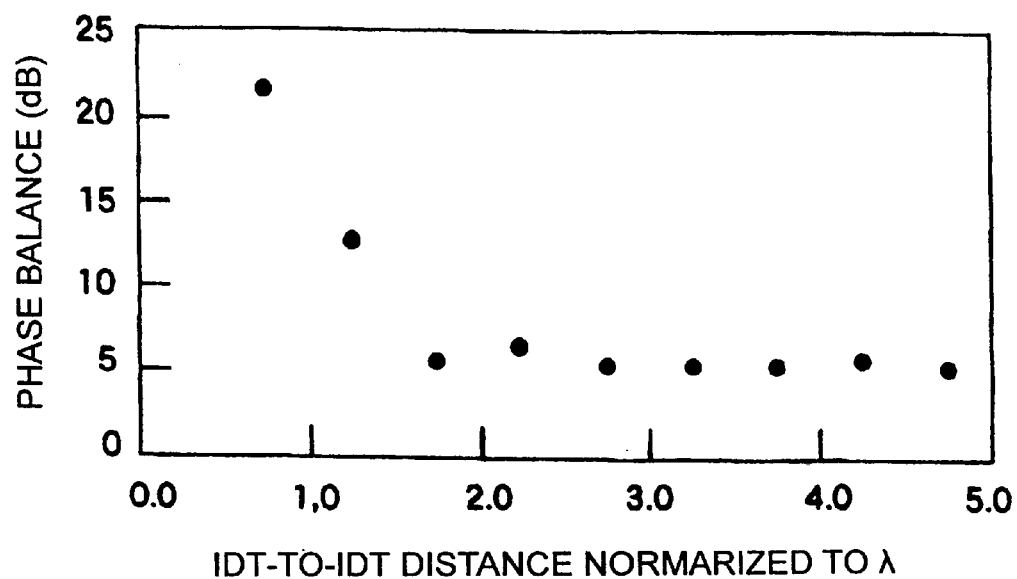
FIG. 10 is a graph illustrating the dependence of the phase balance upon the space between adjacent IDTs.

FIG. 10 shows the dependence of the phase balance of the surface acoustic wave filter device of the present preferred embodiment upon the spaces GI between adjacent IDTs in the second surface acoustic wave filter element 2 for the case where the space GI between adjacent IDTs of the surface acoustic wave filter element 2 is substantially equal to $(0.77+m/2)\times\lambda$ and the space GI between adjacent IDTs of the surface acoustic wave filter element 3 is substantially equal to $(1.27+m/2)\times\lambda$.

From FIGS. 9 and 10, it can be seen that in order to meet the requirement that the amplitude balance should be equal to or less than about 1.5 dB and the phase balance should be equal to or less than about 10°, the space between IDTs should be equal to or greater than about 1.77 $\lambda$ and m should be equal to or greater than 1. The reason why the balance becomes worse when the space between adjacent IDTs is small can be understood as follows.

In the case of surface acoustic wave filter devices of the cascade-coupled resonator type, adjacent IDTs are coupled not only acoustically but also can be coupled electromagnetically. In the transmission characteristic resulting from the acoustic coupling, the phases of the surface acoustic wave filter elements 2 and 3 become opposite to each other, if the space between adjacent IDTs is different by about 0.5 $\lambda$ between the surface acoustic wave filter elements 2 and 3. However, the transmission characteristic resulting from the electromagnetic coupling does not depend upon the space between adjacent IDTs, and thus an equal phase and an equal amplitude are obtained. The transmission components having the same phase and the same amplitude cause degradation in the degree of balance. Thus, a reduction in the space between IDTs results in an increase in the electromagnetic coupling which in turn results in degradation in the degree of balance.

From the above discussion, it can be concluded that the filter characteristic in terms of the degree of balance and the bandwidth can be good enough for practical use, if the spaces $A_1$ and $A_2$ between adjacent IDTs in the surface acoustic wave filter element 2 are substantially equal to $(0.77+n/2)\times\lambda$ where n=1, 2, 3, 4, 5 and if the space GI between adjacent IDTs in the surface acoustic wave filter element 3 is substantially equal to $(1.27+n/2)\times\lambda$ where n is an integer from 1 to 5.

When the frequency variation due to a temperature variation is taken account, the bandwidth is required to be equal to or greater than about 39 MHz. This requirement can be met if the spaces $A_1$ and $A_2$ between adjacent IDTs in the surface acoustic wave filter element 2 are substantially equal to $(0.77+n/2)\times\lambda$ where n is an integer from 1 to 3 and if the space GI between adjacent IDTs in the surface acoustic wave filter element 3 is substantially equal to $(1.27+n/2)\times\lambda$ where n is an integer from 1 to 3.

If the space GI between adjacent IDTs in the surface acoustic wave filter element 2 is substantially equal to $(0.77+n2)\times\lambda$ where n=2 and if the spaces $B_1$ and $B_2$ between adjacent IDTs in the surface acoustic wave filter element 3 are substantially equal to $(1.27+n2)\times\lambda$ where n+2, the largest bandwidth can be achieved without causing degradation in the degree of balance.

When the piezoelectric substrate is made of a $LiTaO_3$ single crystal with an orientation rotated around the X axis by about 36° to about 44° from the Y axis to the Z axis, two types of surface acoustic waves can be excited and propagated. One is a leaky wave or a pseudo surface acoustic wave, and the other is a bulk wave called SSBW. Of these, the leaky wave is mainly used in resonators or filters. If propagation of SSBW becomes dominant, the propagation loss becomes large. As a result, degradation in Q occurs in resonators and the insertion loss of filters becomes large. The two types of surface acoustic waves described above are excited and propagated in a mixed fashion. When the surface is in an almost electrically short-circuited state, that is, when the electrode covering ratio is large, propagation of leaky waves becomes dominant. Conversely, when the surface is in an almost electrically open state, that is, when the electrode covering ration is small, propagation of SSBW becomes dominant.

Therefore, if, in the second surface acoustic wave filter element, at least one electrode finger is disposed in first spaces between the IDT at the central location and the second and third IDTs at outer locations, and if, in the third surface acoustic wave filter element, at least one electrode finger is disposed in second spaces between the IDT at the central location and the second and third IDTs at outer locations thereby increasing the electrode covering ratio, propagation of leaky waves becomes dominant and excitation and propagation of SSBW are suppressed and thus a reduction in the insertion loss is achieved.

Figure 8:
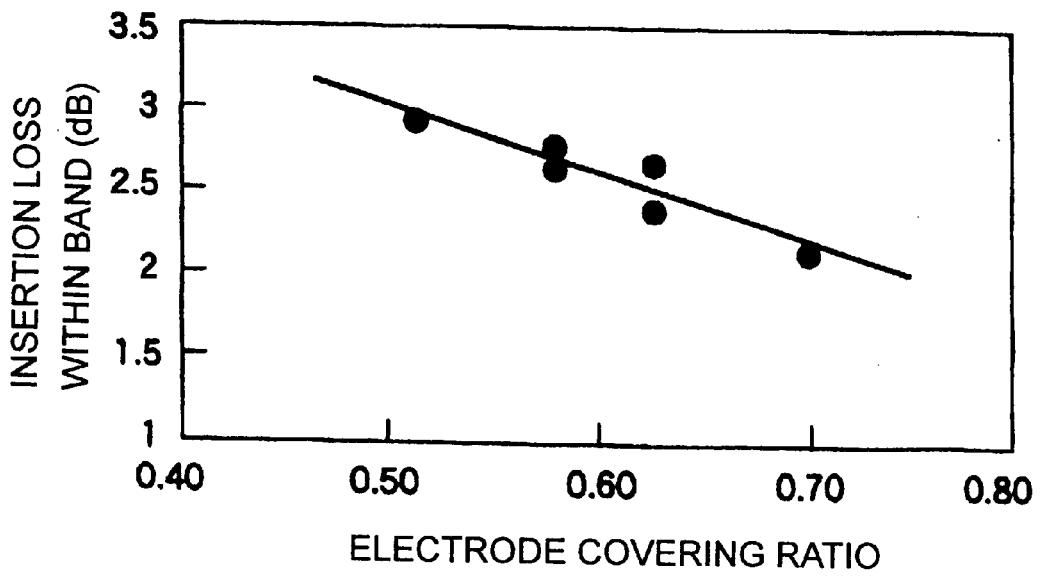
FIG. 8 is a graph illustrating the dependence of the insertion loss within the passband upon the space between adjacent IDTs.

FIG. 8 illustrates the dependence of the insertion loss in the passband upon the electrode covering ratio in the first spaces described above. It can be seen that the electrode covering ratio should be equal to or greater than about 0.5 or about 50% to obtain a low insertion loss equal to or smaller than about 3.0 dB within the passband, which is required in practical use. In order to obtain an insertion loss lower than about 2.5 dB for use in applications in which low loss is required, the electrode covering ratio should be equal to or greater than about 0.63 or about 63%. The above discussion applies to the second spaces.

The signal input to the second surface acoustic wave filter element 2 excites surface acoustic waves via the IDTs 2b ad 2c. The surface acoustic waves propagate in the particular propagation directions and are reflected by the reflectors 2d and 2e. The reflected surface acoustic waves interfere with the excited surface acoustic waves. As a result, a standing wave is created between the reflectors 2d and 2e. The standing wave allows the resonance to have very high Q. Furthermore, the excited standing wave is received by the IDT 2a and converted into an electrical signal by the IDT 2a and thus a function of a filter is achieved. A similar operation is also performed in the third surface acoustic wave filter element 3. However, in the third surface acoustic wave filter element 3, because the output signal is determined by the relative positional relationship between the excited standing wave and the IDT 3a at the output side, the location of the IDT 3a is shifted by about 0.5 times the wavelength λ of the surface acoustic wave so that the output signal has a phase opposite to the output signal of the second surface acoustic wave filter element.

Herein, if the distance C between the two reflectors 2d and 2e of the surface acoustic wave filter element 2 and the distance D between the two reflectors 3d and 3e of the surface acoustic wave filter element 3 are different from each other, the amplitude distribution becomes different between the two surface acoustic wave filter elements. As a result, the resonance characteristic and the filter characteristic also become different. In view of the above, the distance C between the two reflectors 2d and 2e of the surface acoustic wave filter element 2 and the distance D between the two reflectors 3d and 3e of the surface acoustic wave filter element 3 are preferably substantially equal to each other so that no difference occurs in the filter characteristic between the surface acoustic wave filter elements 2 and 3 and thus no degradation occurs in the degree of balance.

In the present preferred embodiment, the grating type reflectors are used as the reflectors 1d, 1e, 2d, 2e, 3d, and 3e. However, the reflectors are not limited to the grating type. For example, reflectors using reflection at the ends of the piezoelectric substrate may also be used.

In the present preferred embodiment, the characteristic impedance at the input terminal (unbalanced terminal) 4 is preferably about 50 Ω and the characteristic impedance at the output terminals 5 and 6 (balanced terminals) is preferably about 150 Ω. That is, in the present preferred embodiment, as described above, the interdigitally overlapping length of the surface acoustic wave filter element 1 is preferably equal to about 51 Ω so that the input impedance matches the characteristic impedance of about 50 Ω of an unbalanced circuit connected to the input terminal. On the other hand, in the surface acoustic wave filter element 2 and 3, the interdigitally overlapping length is preferably about 31 Ω so that the output impedance matches one-half the characteristic impedance of 150 Ω of a balanced circuit connected to the output terminal, taking into account the fact that when each of the terminals 5 and 6 of the balanced circuit is regarded as an unbalanced terminal, the characteristic impedance becomes equal to one-half the characteristic impedance of the balanced circuit.

The ratio of the output impedance to the input impedance can be set to an arbitrary desired value by achieving the impedance matching with the unbalanced circuit connected to the input terminal, using the surface acoustic wave filter element 1, and achieving the impedance matching with the balanced circuit connected to the output terminals, using the surface acoustic wave filter elements 2 and 3.

Figure 11:
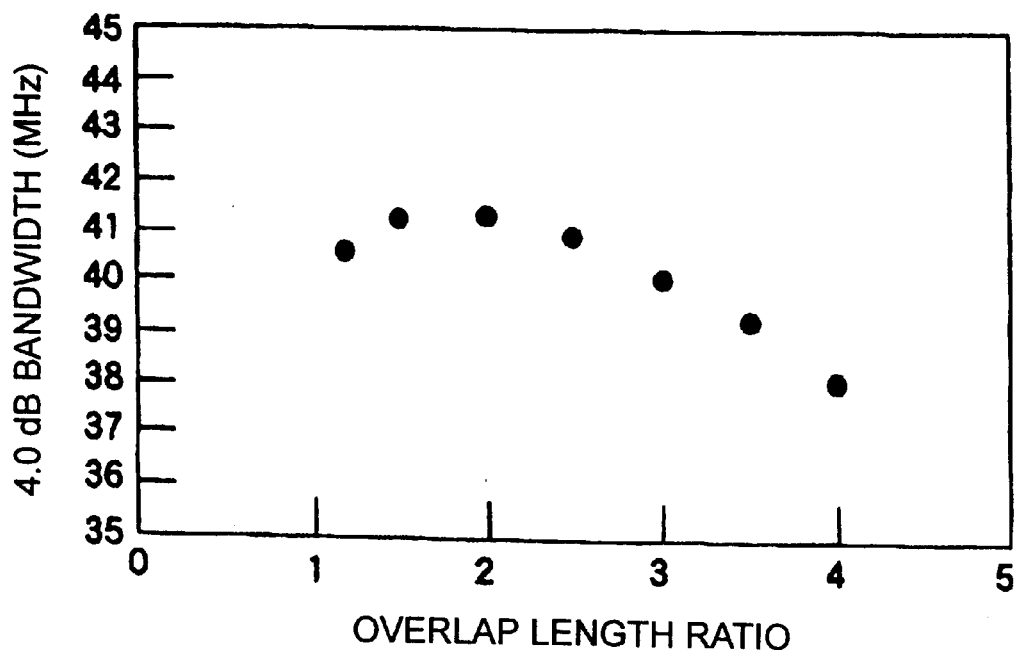
FIG. 11 is a graph illustrating the dependence of the 4.0-dB bandwidth upon the ratio of the interdigital overlapping length of the electrode finger.

FIG. 11 shows the dependence of the bandwidth upon the ratio of the interdigital overlapping length of the surface acoustic wave filter element 1 connected to the unbalanced terminal 4 to the interdigital overlapping length of the surface acoustic wave filter elements 2 and 3 connected to the balanced terminals. It can be seen from FIG. 11 that the bandwidth becomes maximum when the interdigital overlapping length ratio is substantially equal to about 2.0. If the interdigital overlapping length ratio is greater than about 3.5, the bandwidth decreases by 5% or greater, and the yield decreases.

Figure 12:
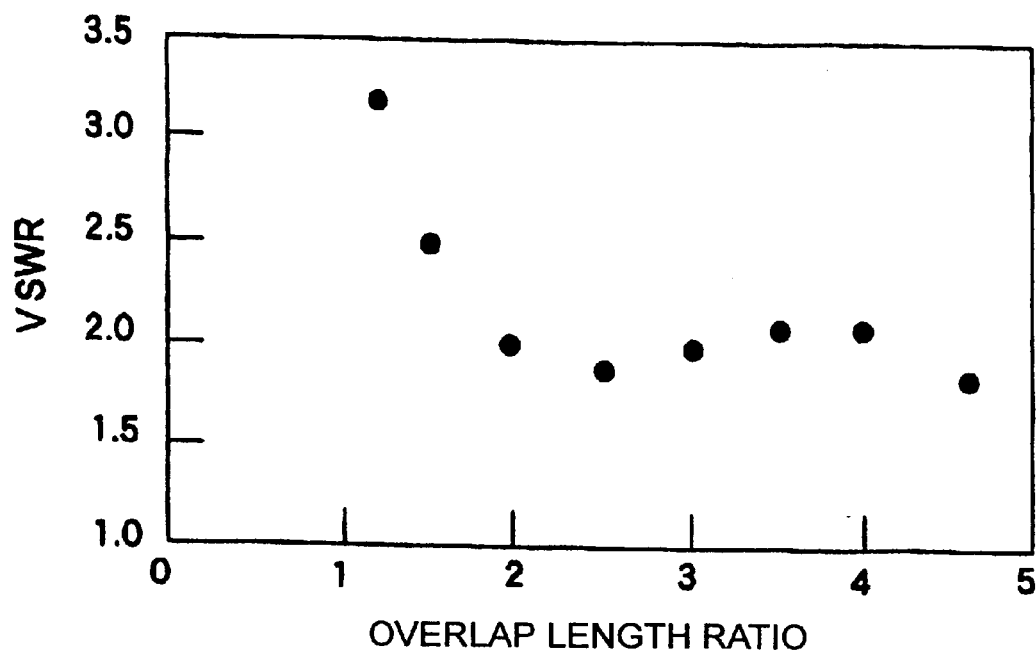
FIG. 12 is a graph illustrating the dependence of VSWR upon the ratio of the interdigital overlapping length of the electrode finger.

FIG. 12 shows the dependence of VSWR within the passband upon the ratio of the interdigitally overlapping length of the surface acoustic wave filter element 1 connected to the unbalanced terminals 5 and 6 to the interdigitally overlapping length of the surface acoustic wave filter elements 2 and 3 connected to the balanced terminals. VSWR becomes best when the interdigitally overlapping length ratio is substantially equal to about 2.5. If the interdigitally overlapping length ratio is smaller than about 1.5, VSWR becomes very bad and problems occur in practical use. Thus, it is desirable to set the ratio of the interdigitally overlapping length of electrode fingers within the range from about 1.5 to about 3.5.

Figure 13:
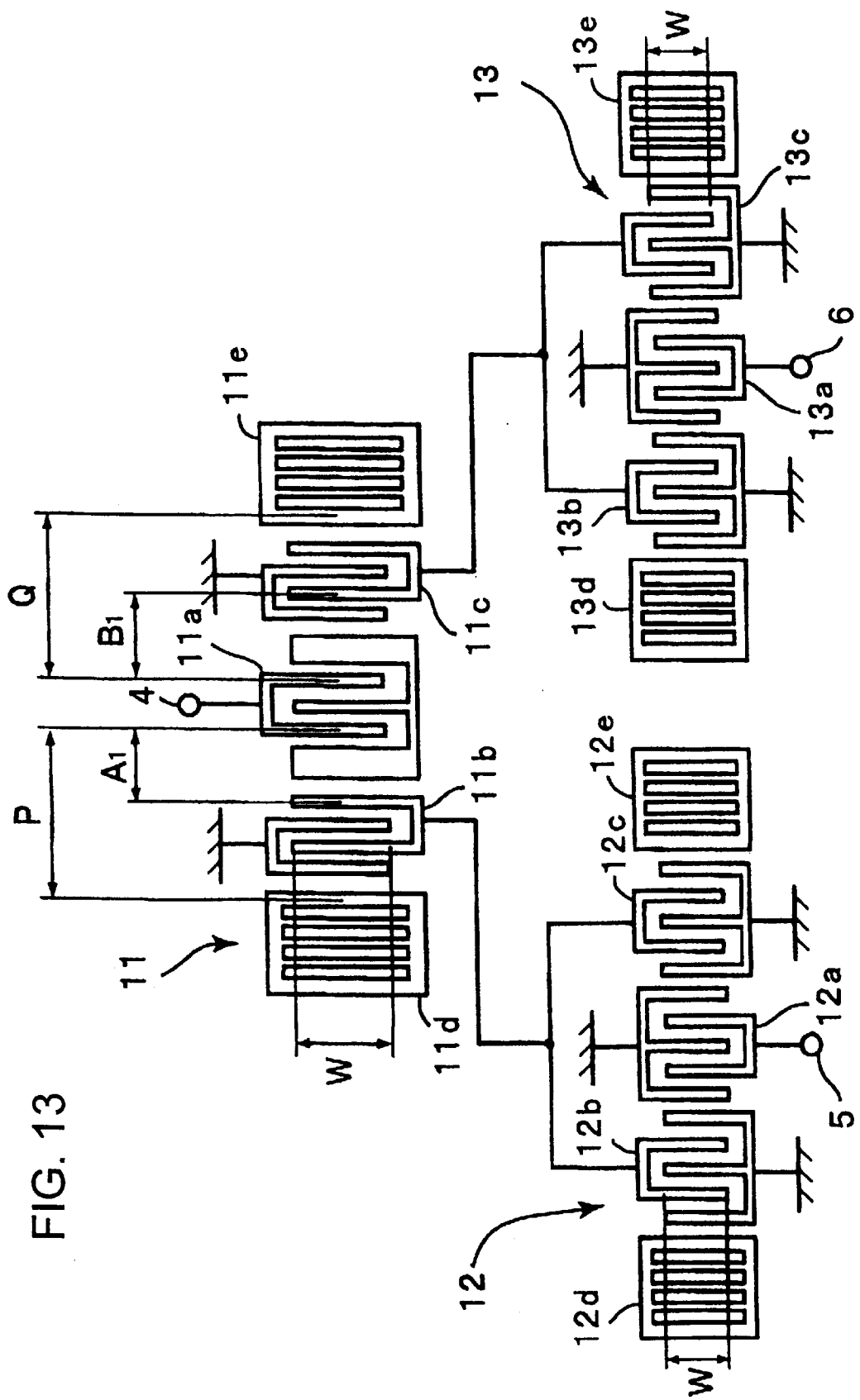
FIG. 13 is a plan view schematically illustrating the electrode structure of a surface acoustic wave filter device according to a second preferred embodiment of the present invention.

FIG. 13 is a plan view illustrating the electrode structure of a second preferred embodiment of a surface acoustic wave filter device according to the present invention. In the present preferred embodiment, three surface acoustic wave filter elements 11 to 13 are disposed on a piezoelectric substrate that is not shown in the figure. A substrate made of a proper piezoelectric material such as $LiTaO_3$ or quartz may be used as the piezoelectric substrate. In this preferred embodiment, a 36° Y-X $LiTaO_3$ substrate is preferably used. The basic structure and the structure associated with connections of the first to third surface acoustic wave filter elements 1 to 13 are similar to those in the first preferred embodiment, and similar elements are denoted by similar reference numerals and they are not described further herein.

The surface acoustic wave filter device of the second preferred embodiment is different in the electrode structure of the first to third surface acoustic wave filter elements 11 to 13 from the surface acoustic wave filter device of the first preferred embodiment.

In the present preferred embodiment, as will be described later, the surface acoustic wave filter elements 11 and 12 are constructed such that the electrical signals output from the IDTs disposed at outer locations in the first surface acoustic wave filter element 11, that is, the second and third IDTs 11b and 11c, are different in transmission phase characteristic by about 180°. Thus, the electrical signals which are the same in amplitude but different in phase by about 180° are applied to the second and third surface acoustic wave filter elements 12 and 13.

In the first surface acoustic wave filter element 11 of the present preferred embodiment, the interdigital overlapping length W of the electrode finger of the IDTs 11a to 11c is preferably equal to about 52 λ, where λ is the wavelength of the surface acoustic wave.

In the first surface acoustic wave filter element 11, the first IDT 1a disposed at the central location has 16 pairs of electrode fingers, and the IDTs disposed at outer locations, that is, the second and third IDTs 11b and 11c each have 11 pairs of electrode fingers. In the IDTs 11a to 11c, the wavelength λI of the surface acoustic wave is preferably equal to about 4.2 μm. The reflectors 11d and 11e each have 120 electrode fingers, and the wavelength λR is preferably equal to about 4.3 μm. The space $A_1$ between the first IDT 11a and the second IDT 11b is preferably equal to about 1.77 λR, and the space $B_1$ between the first IDT 11a and the third IDT 11c is preferably equal to about 2.27λR.

In the second surface acoustic wave filter element 12, the interdigital overlapping length W of the electrode finger is preferably equal to about 31 λ, the first IDT 12a disposed at the central location has 16 pairs of electrode fingers, and the IDTs at outer locations, that is, the second and third IDTs 12b and 12c each have 11 pairs of electrode fingers. In the IDTs 12a to 12c, the wavelength λI of the surface acoustic wave is preferably equal to about 4.2 μm. The reflectors 12d and 12e each have 120 electrode fingers, and the wavelength λR is preferably equal to about 4.3 μm. The space $A_2$ between the first IDT 12a and the second IDT 12b is preferably equal to about 1.77 λR, and the space $B_2$ between the first IDT 12a and the third IDT 12c is preferably equal to about 1.77 λR.

The third surface acoustic wave filter element 13 is preferably constructed in the same manner as the second surface acoustic wave filter element 13. The operation of the surface wave acoustic filter element of the second preferred embodiment is described below for the case where the input terminal 4 is used as an unbalanced input terminal and the output terminals 5 and 6 are used as balanced output terminals.

When an electrical signal is applied to the input terminal 4, a surface acoustic wave is excited by the first IDT 11a of the first surface acoustic wave filter element. The surface acoustic wave propagates in a direction that is substantially perpendicular to the direction in which the electrode fingers extend and is reflected by reflectors 11d and 11e. The reflected surface acoustic wave interferes with the excited surface acoustic wave. As a result, a standing wave is created between the two reflectors 11d and 11e. The standing wave allows resonance to occur with very high Q. The excited standing wave is received by the IDTs 11b and 11c located on the output side and converted to electrical signals. Thus, the first surface acoustic wave filter element 11 operates as a filter.

Herein, the output signal is determined by the relative positional relationship between the standing wave and the IDTs 11b and 11c located on the output side, the location of either the IDT 11b or the IDT 11c is shifted by about 0.5 times the wavelength λ of the surface acoustic wave so that the phase is inverted. In the second preferred embodiment, the first and second spaces $A_1$ and $B_1$ are determined as described above so that the electrical signal output from the IDT 11b and the electrical signal output from the IDT 11c are different in phase by about 180° from each other. As a result, the electrical signals which are the same in amplitude but different in phase by about 180° are applied to the second and third surface acoustic wave filter elements 12 and 13. The output signals are filtered by the second and third surface acoustic wave filter elements 12 and 13, and the resultant signals are output as balanced signals to the output terminals 5 and 6.

The results shown in FIGS. 5 and 6 also apply to this second preferred embodiment, and thus the difference between the first space $A_1$ between the IDT 1a and the IDT 1b and the second space $B_1$ between the IDT 1a and the IDT 1c is preferably set within the range from about 0.48 λ to about 0.525 λ.

A wideband characteristic can be achieved without having degradation in the degree of balance, by setting the above-described IDT-to-IDT spaces to be within a combination of the range from about (n/2+1.22)×λ to about (n/2+1.33)×λ (n is an integer of 0 to 4) and the range from about (n/2+1.72)×λ to about (n/2+1.83)×λ (n is an integer of 0 to 4).

As in the first preferred embodiment, if, in the second surface acoustic wave filter element 12, at least one electrode finger is disposed in first spaces between the IDT 12a at the central location and the second and third IDTs 12b and 12c at outer locations, and if, in the third surface acoustic wave filter element, at least one electrode finger is disposed in second spaces between the first IDT 13a at the central location and the second and third IDTs 13b and 13c at outer locations thereby increasing the electrode covering ratio, propagation of leaky waves becomes dominant and thus a reduction in the insertion loss is achieved. In the present preferred embodiment, in view of the above, the electrode covering ratio in the first and second spaces described above is preferably about 63% to achieve a reduction in the insertion loss.

In the present preferred embodiment, the first and second spaces are preferably different from each other so that degradation in the amplitude balance is prevented.

Furthermore, in the first surface acoustic wave filter element 11, the distance P between the first IDT 11a the reflector 11d and the distance $P_2$ between the first IDT 11a and the reflector 11e are preferably substantially equal to each other so that the excited amplitude distribution of the standing wave created in the first surface acoustic wave filter element does not become asymmetrical. As a result, the intensities of the surface acoustic waves received by the IDTs 11b an 11c become substantially equal, and suppression in degradation in the degree of balance is achieved. Herein, the distance P is defined as the distance from the center of an electrode finger, which is one of the IDT 11a's electrode fingers connected to a signal line and which is disposed at an outermost location, to the center of an innermost electrode finger of the reflector 11d, and the distance Q is defined as the distance from the center of an electrode finger, which is one of the IDT 11a's electrode fingers connected to the signal line and which is disposed at the outermost location on the opposite side, to the center of an innermost electrode finger of the reflector 11e.

Figure 14:
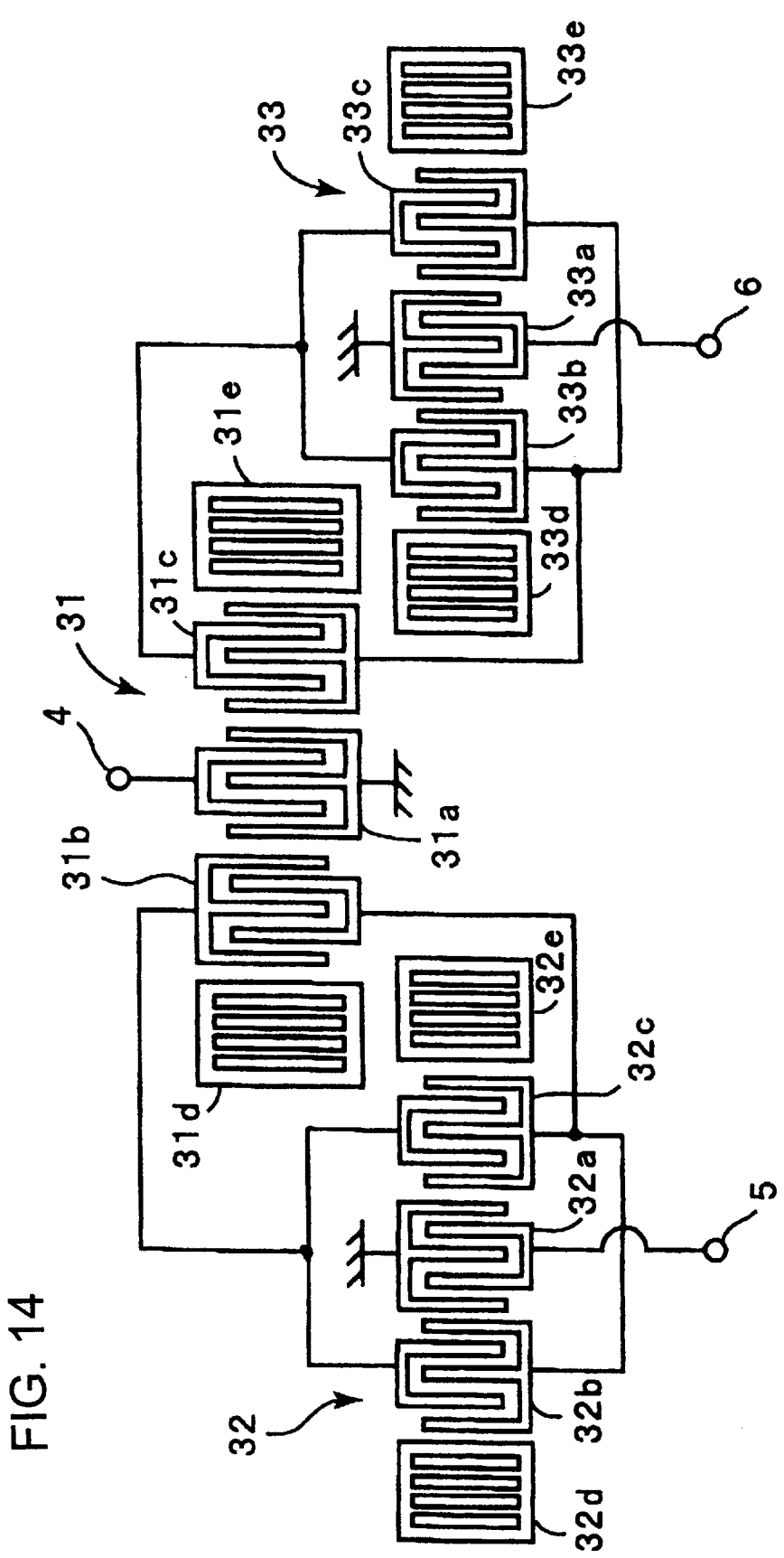
FIG. 14 is a plan view schematically illustrating the electrode structure of a surface acoustic wave filter device according to a third preferred embodiment of the present invention.

FIG. 14 is a plan view schematically illustrating the electrode structure of a third preferred embodiment of a surface acoustic wave filter device. Also in this third preferred embodiment, three surface acoustic wave filter elements 31 to 33 are disposed on a piezoelectric substrate. The respective surface acoustic wave filter elements 31 to 33 are preferably formed in the same manner as in the second preferred embodiment. Similar elements to those in the second preferred embodiment are denoted by similar reference numerals and they are not described further herein.

In this third preferred embodiment, the manner of connecting the surface acoustic wave filter element 31 to the surface acoustic wave filter elements 32 and 33 is different from that in the second preferred embodiment.

That is, in the third preferred embodiment, the IDTs disposed at outer locations in the first to third surface acoustic wave filter elements 31 to 33, that is, the IDTs 31b, 31c, 32b, 32c, 33b, and 33c, are not grounded but floated.

More specifically, one comb-shaped electrode of the second IDT 31b of the first surface acoustic wave filter element 31 is connected to one end of each of the second and third IDTs 32b and 32c of the second surface acoustic wave filter element 32. Furthermore, the other end of the IDT 31b is connected to the other end of each of the IDTs 32b and 32c of the second surface acoustic wave filter element 32. Similarly, one end of the third IDT 31c of the first surface acoustic wave filter element 31 is connected to one end of each of the second and third IDTs 33b and 33c of the third surface acoustic wave filter element 33, and the second end of the IDT 31c is connected to the second end of each of the IDTS 33b and 33c.

Reflectors are denoted by reference numerals 31d, 31e, 32d, 32e, 33d, and 33e. Except for the above, the surface acoustic wave filter device of the present preferred embodiment is similar to that of the second preferred embodiment.

Thus, the surface acoustic wave filter device of the third preferred embodiment operates in a manner similar to the surface acoustic wave filter device of the second preferred embodiment, and therefore similar advantages are obtained. The above-described connection structure used herein allows a great reduction in the number of bonding pads for connection to ground and also allows a reduction in the size of the surface acoustic wave filter device. Furthermore, the above-described connection structure allows a reduction in parasitic capacitance associated with the bonding pads and the interconnections to the bonding pads.

Figure 15:
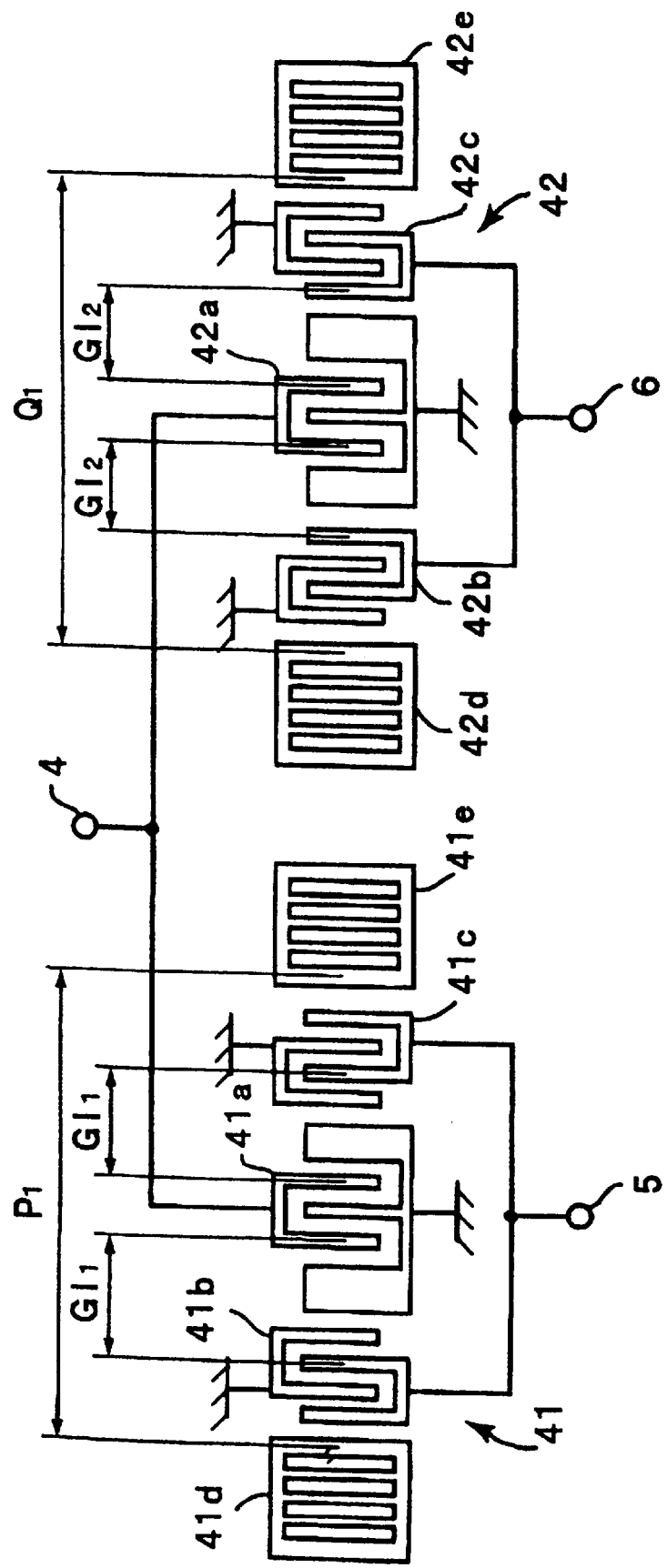
FIG. 15 is a plan view schematically illustrating the electrode structure of a surface acoustic wave filter device according to a fourth preferred embodiment of the present invention.

FIG. 15 is a plan view schematically illustrating the electrode structure of a fourth preferred embodiment of a surface acoustic wave filter device according to the present invention.

In the surface acoustic wave filter device of the present preferred embodiment, first and second surface acoustic wave filter elements 41 and 42 are disposed on a piezoelectric substrate which is not shown in the figure. A substrate made of piezoelectric ceramics or piezoelectric single crystal may be used as the piezoelectric substrate. In this preferred embodiment, a 36° Y-X LiTaO$_3$ substrate is preferably used.

The first and second surface acoustic wave filter elements 41 and 42 are both resonator-type surface acoustic wave filter elements each having three IDTs 41a to 41c or 42a to 42c.

A first end of the first IDT 41a disposed at the central location in the surface acoustic wave filter element 41 and a first end of the first IDT 42a disposed at the central location in the second surface acoustic wave filter element 42 are connected in common to an input terminal 4.

The second end of each of the first IDTs 41a and 42a is grounded. On the other hand, outer IDTs, that is, IDTs 41b and 41c are connected to an output terminal 5, and one end of each of the outer IDTs, that is, the second and third IDTs 42b and 42c, is connected to an output terminal 6. The other end of each of the second and third IDTs 41b, 41c, 42b, and 42c is grounded.

Reflectors 41d and 41e are respectively disposed on opposite sides of the area where the IDTs 41a to 41c are disposed, and reflectors 42d and 42e are respectively disposed on opposite sides of the area where the IDTs 42a to 42c are disposed.

In the present preferred embodiment, the transmission phase characteristic of the first surface acoustic wave filter element 41 is different by about 180° from that of the second surface acoustic wave filter element 41.

More specifically, in the first surface acoustic wave filter element 41, the interdigital overlapping length W of the electrode finger is preferably equal to about 31 λ, the IDT 41a has 16 pairs of electrode fingers, and the IDTs 41b and 41c each have 11 pairs of electrode fingers. λI of the IDTs 41a to 41c is preferably equal to about 4.2 μm. The reflectors 41d and 41e each have 120 electrode fingers, and the wavelength λR of the reflectors 41d and 42e is preferably equal to about 4.3 μm. The first space GI$_1$ between the IDT 41a and the IDT 41b or 41c is preferably equal to about 1.75 λR.

The second surface acoustic wave filter element 42 is preferably formed in a manner similar to the first surface acoustic wave filter element 41 except that the second space GI$_2$ between the IDT 42a and the IDT 42b or 42c is equal to about 2.25 λR. The first and second spaces are preferably different from each other as described above so that the first surface acoustic wave filter element 41 and the second surface acoustic wave filter element 42 have substantially the same transmission amplitude characteristic but have a transmission phase characteristic different by about 180°.

The operation of the surface wave acoustic filter element of the present preferred embodiment is described below for the case where the input terminal 4 is used as an unbalanced input terminal and the output terminals 5 and 6 are used as balanced output terminals.

When an electrical signal is input to the input terminal 4, signals having the same phase and amplitude are applied to the first and second surface acoustic wave filter elements 41 and 42. These signals are applied to the IDTs 41a and 42a and thus surface acoustic waves are excited. The surface acoustic waves propagate in a direction that is substantially perpendicular to the direction in which the electrode fingers extend and are reflected by the reflectors 41d and 41e or the reflectors 42d and 42e. The reflected surface acoustic waves interfere with the excited surface acoustic waves, and thus standing waves are created between the two reflectors 41d and 41e and between the two reflectors 42d and 42e. As a result, resonance with very high Q occurs. The excited standing waves are received by the IDTs 41b, 41c, 42b, and 42c connected to the output terminal 5 or 6 and converted to electrical signals. Herein, the output signals are determined by the relative positional relationship between the excited standing waves and the IDTs 41b, 41c, 42b, and 42c disposed on the output side.

In the present preferred embodiment, the first space between the IDT 41a and the IDT 41b or 41c in the surface acoustic wave filter element 41 and the second space between the IDT 42a and the IDT 42b or 42c in the second surface acoustic wave filter element 42 are preferably different from each other by about 0.50 times the wavelength of the surface acoustic wave. As a result, the signal output from the first surface acoustic wave filter element 41 and the signal output from the second surface acoustic wave filter element 42 become opposite in phase.

That is, the surface acoustic wave filter elements 41 and 42 have transmission phase characteristic different by 180° from each other, and electrical signals which are substantially equal in amplitude but different in phase by 180° are output from the surface acoustic wave filter elements 41 and 42 to the respective output terminals 5 and 6 serving as balanced output terminals.

In the present preferred embodiment, a one-stage filter is provided to include the two surface acoustic wave filter elements 41 and 42, wherein the one-stage structure makes it possible to reduce the insertion loss within the band to a very low level.

Figure 16:
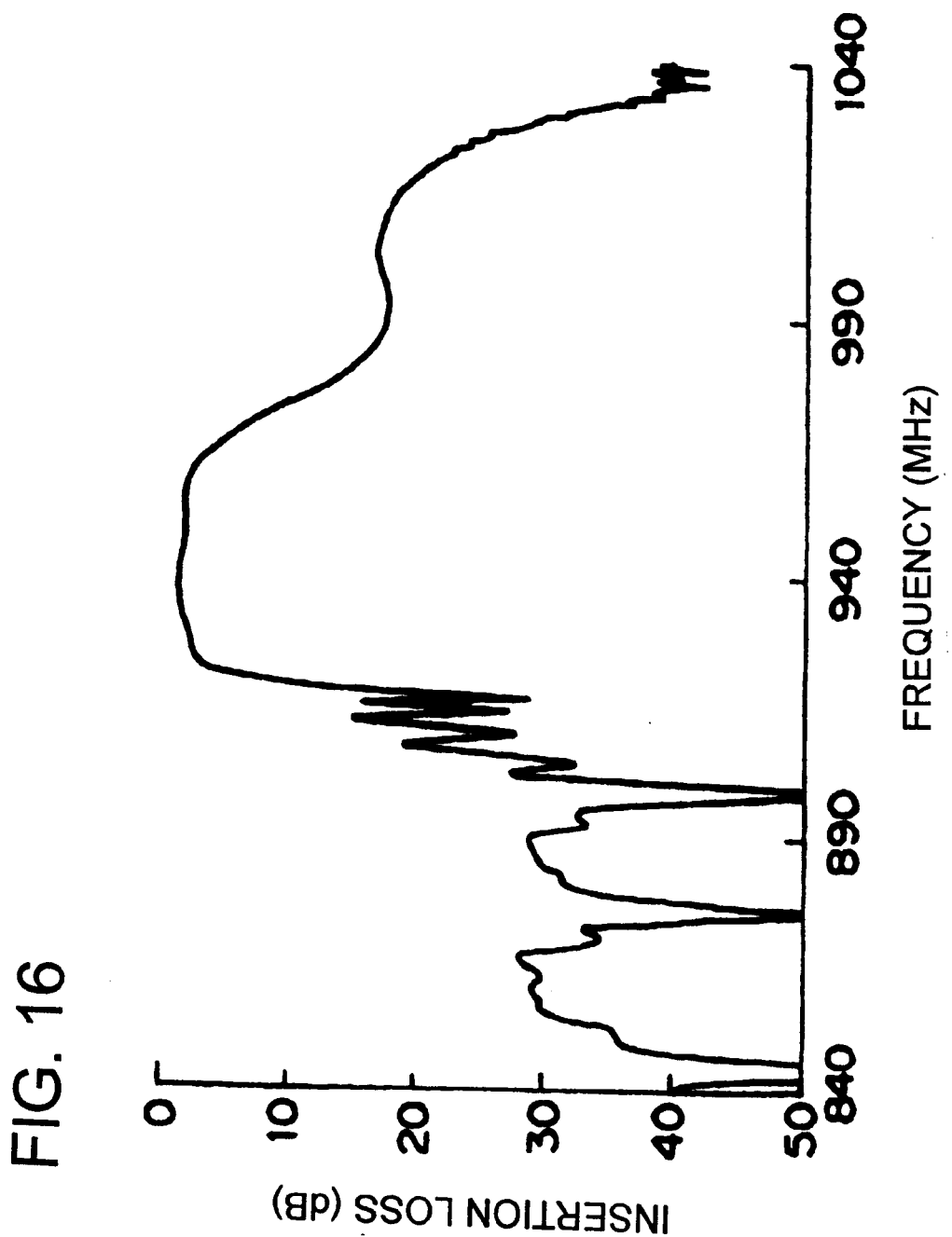
FIG. 16 is a graph illustrating the filter characteristic of the surface acoustic wave filter device according to the fourth preferred embodiment of the present invention.

The filter characteristic of the surface acoustic wave filter device of the fourth preferred embodiment is shown in FIG. 16. FIG. 16 indicates that a reduction in loss within the passband is achieved.

The results shown in FIGS. 5 and 6 also apply to this fourth preferred embodiment, and thus the difference between the first space and the second space is preferably within the range from about 0.48 λ to about 0.525 λ.

A wideband characteristic can be achieved without having degradation in the degree of balance, by setting the first and second spaces within a combination of the range from about $(n/2+1.22) \times \lambda$ to $(n/2+1.33) \times \lambda$ (n is an integer of 0 to 4) and the range from about $(n/2+1.72) \times \lambda$ to $(n/2+1.83) \times \lambda$ (n is an integer of 0 to 4).

Also in this fourth preferred embodiment, as in the first preferred embodiment, if one or more electrode fingers are inserted in the first and second spaces thereby increasing the electrode covering ratio, propagation of leaky waves becomes dominant, and excitation and propagation of SSBW are suppressed. That is, it is possible to provide a low-loss surface acoustic wave filter device by preferably setting the electrode covering ratio in the first and second spaces to be equal to or greater than about 50% and more preferably equal to or greater than about 63%.

In the present preferred embodiment, the locations of the IDTs 42b and 42c disposed on the output side in the second surface acoustic wave filter element 42 are shifted by about 0.5 times the wavelength of the surface acoustic wave with respect to the locations of the IDTs 41b and 41c disposed on the output side in the first surface acoustic wave filter element so as to make the phases opposite to each other as described above.

Herein, if the distance between the two reflectors 41d and 41e in the first surface acoustic wave filter element 41 and the distance between the reflectors 42d and 42e in the second surface acoustic wave filter element 42 are different from each other, the amplitude distribution of the standing wave becomes different between the first and second surface acoustic wave filter elements. Such a difference can result in variations in the resonance characteristic and the filter characteristic. To avoid the above problem, it is desirable that the distance $P_1$ between the reflectors 41d and 41e and the distance $Q_1$ between the reflectors 42d and 42e be substantially equal to each other thereby suppressing the degradation in the degree of balance.

Although grating-type reflectors are preferably used as the reflectors 41d to 42e also in this fourth preferred embodiment, other types of reflectors may also be used. For example, reflectors using reflection at an end surface of a chip may be used.

Furthermore, because the IDT 41a disposed at the central location in the surface acoustic wave filter element 41 and the IDT 42a disposed at the central location in the second surface acoustic wave filter element 42 are connected in common via an electrode pattern on the piezoelectric substrate and further connected to the unbalanced input terminal 4, the parasitic capacitance associated with the surface acoustic wave filter element 41 and the parasitic capacitance associated with the surface acoustic wave filter element 42 are shared by each other. This results in a further improvement in the degree of balance.

Figure 17:
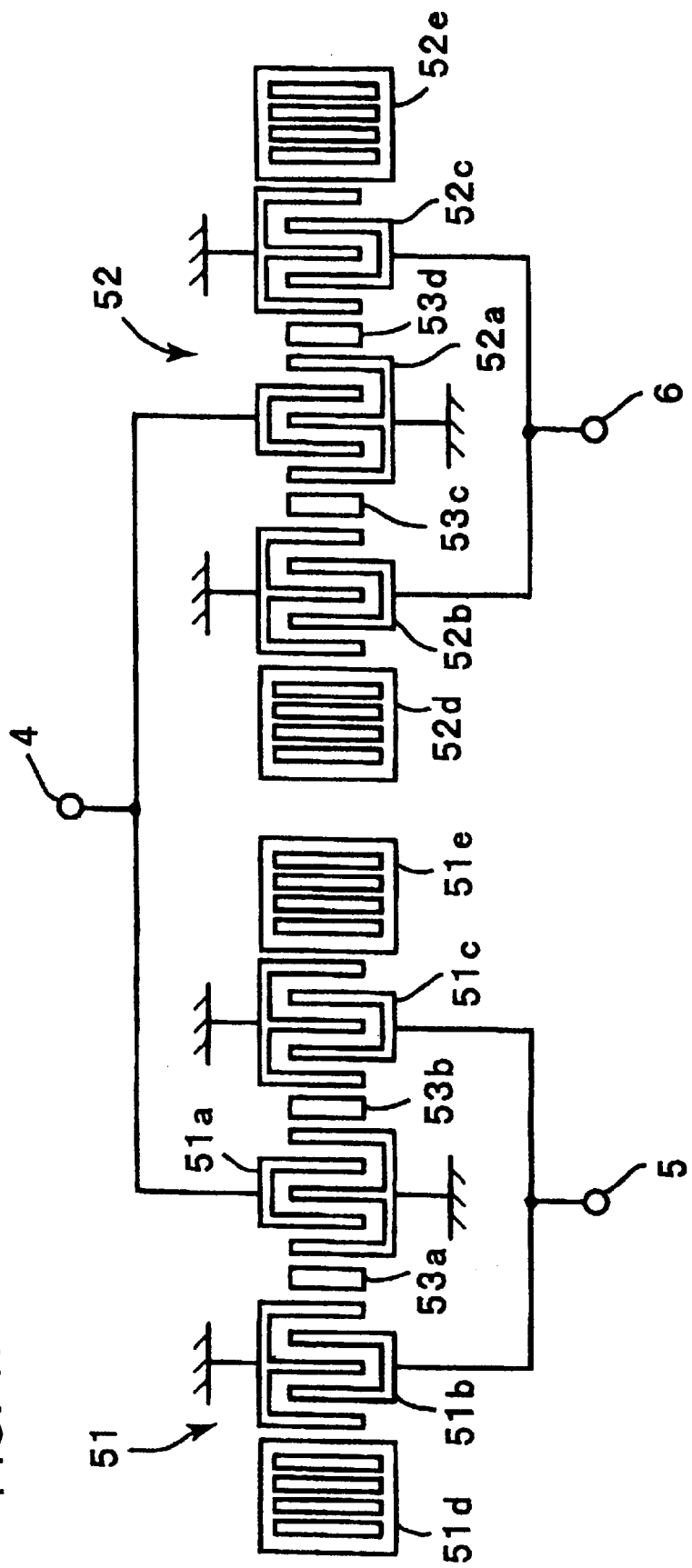
FIG. 17 is a plan view schematically illustrating the electrode structure of a surface acoustic wave filter device according to a fifth preferred embodiment of the present invention.

FIG. 17 is a plan view schematically illustrating the electrode structure of a fifth preferred embodiment of a surface acoustic wave filter device.

Also in the present preferred embodiment, as in the fourth preferred embodiment, two resonator-type surface acoustic wave filter elements are used. That is, first and second surface acoustic wave filter elements 51 and 52 are disposed on a piezoelectric substrate. In the first and second surface acoustic wave filter elements 51 and 52, floating electrode fingers 53a to 53d are respectively disposed in the spaces between the central IDT 51a or 52a and the outer second and third IDTs 51b and 51c or 52b and 52c. The IDTs 51a to 51c and the reflectors 51d and 51e are constructed in a manner similar to the IDTs 41a to 41c and the reflectors 45d and 45e in the surface acoustic wave filter element 41 of the fourth preferred embodiment. The IDTs 52a to 52c and the reflectors 52d and 52e in the second surface acoustic wave filter element 51 are constructed in a manner similar to the IDTs 42a to 42c and the reflectors 42d and 42e in the second surface acoustic wave filter element 42 of the fourth preferred embodiment.

In the present preferred embodiment, as described above, floating electrode fingers 53a to 53d are formed separately from the IDTs so as to achieve an electrode covering ratio greater than about 50% for the spaces between IDTs.

Figure 18:
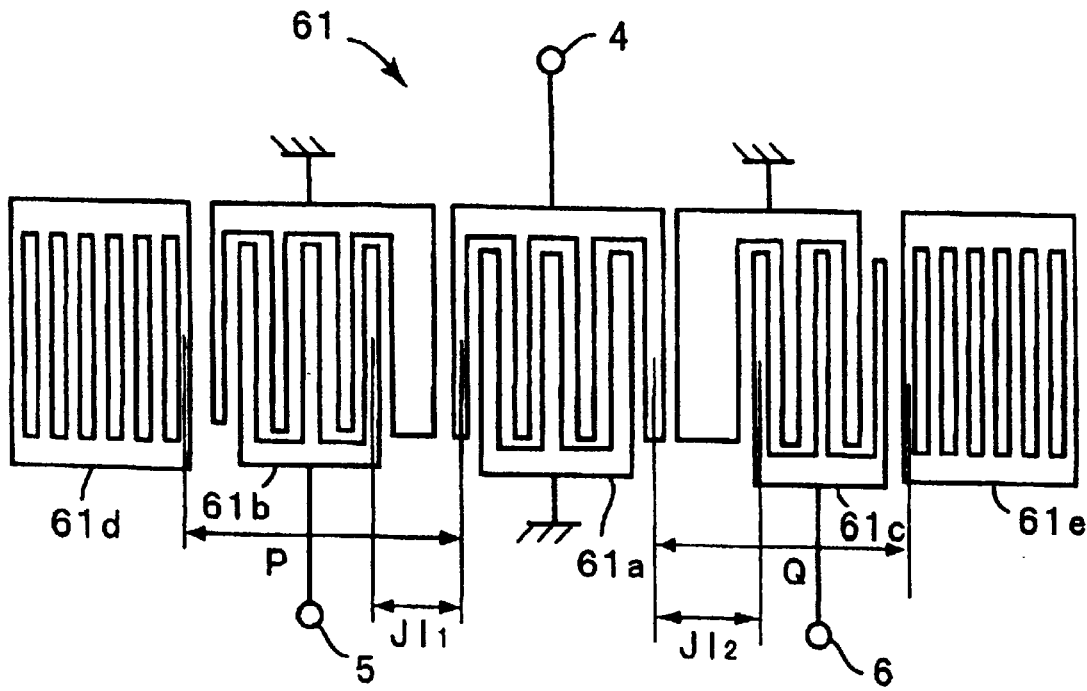
FIG. 18 is a plan view schematically illustrating the electrode structure of a surface acoustic wave filter device according to a sixth preferred embodiment of the present invention.

FIG. 18 is a plan view schematically illustrating a surface acoustic wave filter device according to a sixth preferred embodiment. A surface acoustic wave filter element 61 is disposed on a piezoelectric substrate that is not shown in the figure. In the present preferred embodiment, a 36° Y-X LiTaO$_3$ substrate is preferably used as the piezoelectric substrate. Note that LiTaO$_3$ substrates cut in different orientations or piezoelectric substrates made of other types of piezoelectric materials may also be used.

The surface acoustic wave filter element 61 includes three IDTs 61a to 61c disposed in the same direction as the direction in which the surface acoustic wave propagates. Reflectors 61d and 61e are disposed at respective opposite ends in the area where the IDTs 61a to 61c are disposed.

In the present preferred embodiment, one end of the first IDT 61a at the central location is connected to an input terminal 4 in the form of an unbalanced input terminal. The other end of the IDT 61a is grounded. One end of each of the second and third IDTs 61b and 61c at outer locations is connected to an output terminal 5 or 6 in the form of unbalanced terminals, and the other end of each of the second and third IDTs 61b and 61c is grounded. Reflectors 61d and 61e are constructed to define grating reflectors. Note that other types of reflectors may also be used.

The interdigital overlapping length W of the electrode finger of each IDT 61a to 61c is preferably equal to about 31 λ. The IDT 61a has 16 pairs of electrode fingers, and IDTs 61b and 61c each have 11 pairs of electrode fingers. In the IDTs 61a to 61c, the wavelength λI of the surface acoustic wave is preferably equal to about 4.2 μm.

The reflectors 61d and 61e each have 120 electrode fingers, and the wavelength λR is preferably equal to about 4.3 μm.

The first space JI$_1$ between the IDT 61a and the IDT 61b is preferably equal to about 1.75 λR, and the second space JI$_2$ between the IDT 61a and the IDT 61c is preferably equal to about 2.25 λR, In the surface acoustic wave filter device of the present preferred embodiment, when an electrical signal is applied to the IDT 61a via the input terminal 4, a standing wave is created between the reflectors 61d and 61e as in the first to fifth preferred embodiments. The standing wave allows resonance to occur with very high Q. The excited standing wave is received by the IDTs 61b and 61c and output via the output terminals 5 and 6.

Also in the present preferred embodiment, the output signals are determined by the relative positional relationship between the excited standing wave and the IDTs 61b and 61c disposed on the output side. In the present preferred embodiment, the first space between the IDT 61a and the IDT 61b and the second space between the IDT 61a and the IDT 61c is different from each other by about 0.50 times the wavelength of the surface acoustic wave so that the output signals of the IDTS 61b and 61c become opposite in phase to each other.

That is, the electrical signal output from the IDT 61b and the electrical signal output from the IDT 61c are different in transmission phase characteristic by about 180°, and thus electrical signals which are substantially equal in amplitude but different in phase by about 180° are output from the output terminals 5 and 6.

The results shown in FIGS. 5 and 6 also apply to the present preferred embodiment, and thus the difference between the first space and the second space is preferably within the range from about 0.48 λ to about 0.525 λ. A wideband characteristic can be achieved without having degradation in the degree of balance, by setting the respective spaces JI$_1$ and JI$_2$ within a combination of the range from about (n+1.22)×λ to (n+1.33)×λ (n is an integer of 0 to 4) and the range from about (n+0.72)×λ to (n+0.83)×λ (n is an integer of 0 to 4).

Furthermore, in the present preferred embodiment, the innermost electrode finger of each of the IDTs 61b and 61c is arranged to have a greater width so that the electrode covering ratios in the spaces JI$_1$ and JI$_2$ between IDTs become equal to about 0.63 thereby reducing the propagation loss in the spaces JI$_1$ and JI$_2$ between IDTs. This avoids degradation in the amplitude balance due to the difference between the first and second spaces.

Furthermore, the distances P and Q from the central IDT 61a to the respective reflectors 61d and 61e are preferably substantially equal to each other so that the excited amplitude distribution of the standing wave does not become asymmetrical and so that degradation in the degree of balance is prevented.

Figure 19:
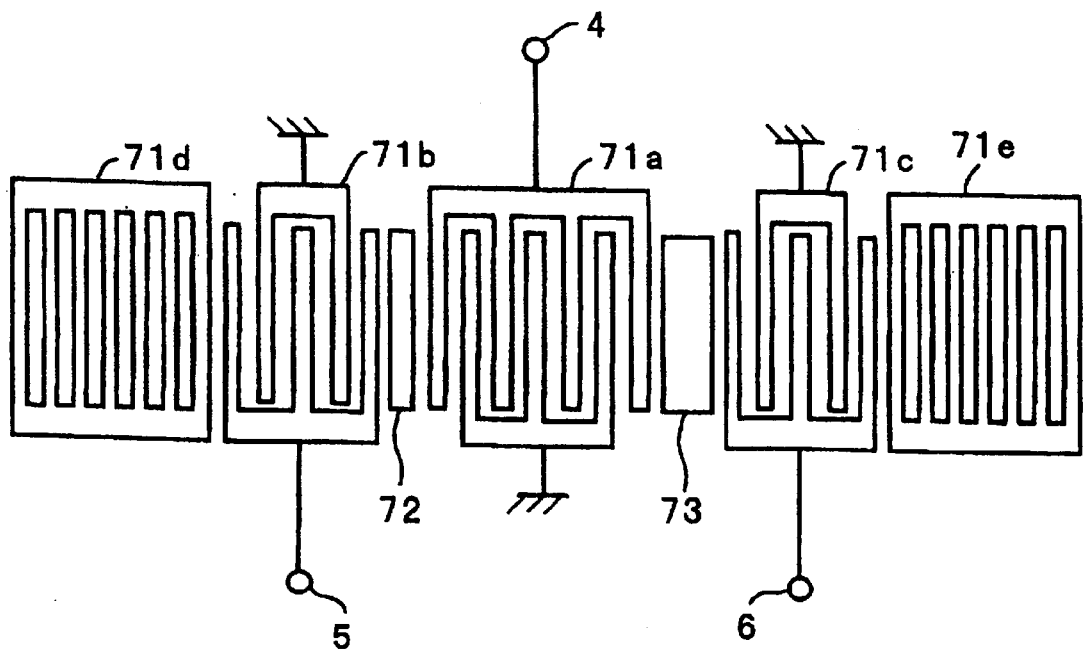
FIG. 19 is a plan view schematically illustrating the electrode structure of a surface acoustic wave filter device according to a seventh preferred embodiment of the present invention.

FIG. 19 is a plan view schematically illustrating a surface acoustic wave filter device according to a seventh preferred embodiment of the present invention. In this seventh preferred embodiment, floating electrode fingers 72 and 73 are respectively disposed in the spaces between a first IDT 71a at the central location and second and third IDTs 71b and 71c at outer locations. Except for the above, the surface acoustic wave filter device of the present preferred embodiment is the same as that of the sixth preferred embodiment. Because the IDT 71a to 71c and the reflectors 71d and 71e are arranged in the same manner as those in the surface acoustic wave filter device of the sixth preferred embodiment, the surface acoustic wave filter device of the present preferred embodiment has similar advantages to those obtained in the sixth preferred embodiment.

Furthermore, the floating electrode fingers 72 and 73 result in an increase in the electrode coverage ratio in the first and second spaces, which in turn results in a reduction in the propagation loss.

Figure 20:
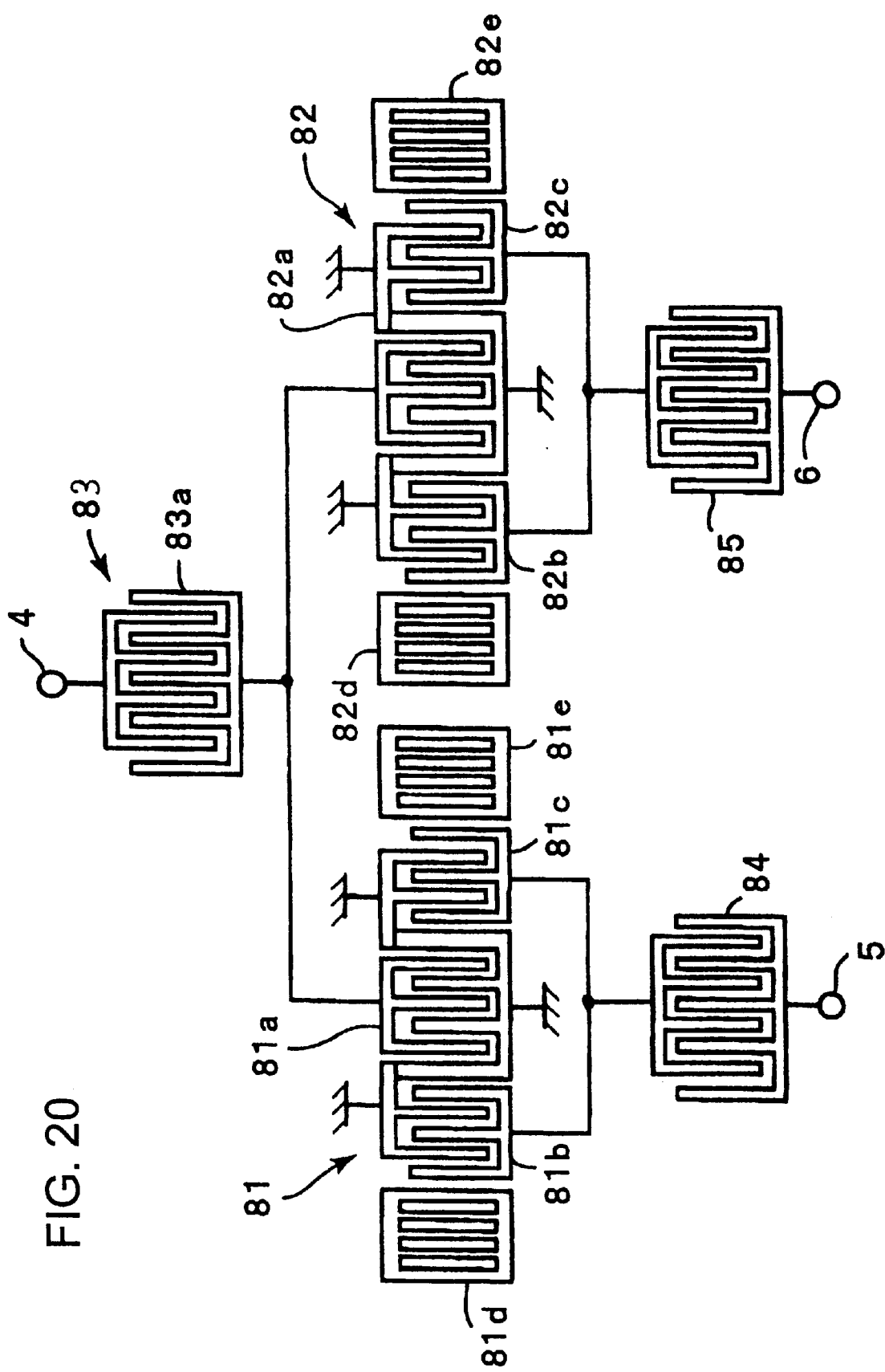
FIG. 20 is a plan view schematically illustrating the electrode structure of a surface acoustic wave filter device according an eighth preferred embodiment of the present invention.

FIG. 20 is a plan view schematically illustrating a surface acoustic wave filter device according to an eighth preferred embodiment of the present invention. First and second surface acoustic wave filter elements 81 and 82 are disposed on a piezoelectric substrate that is not shown in the figure. The first and second surface acoustic wave filter elements 81 and 82 are preferably formed in the same manner as in the surface acoustic wave filter device of the fourth preferred embodiment except that a first surface acoustic wave resonator 83 is connected between an input terminal 4 and first IDTs 81a and 82a at central locations in respective first and second surface acoustic wave filter devices 81 and 82 and except that one pair of surface acoustic wave resonators 84 and 85 are connected from the second and third IDTs 81b and 81c or 82b and 82c at outer locations in the respective first and second surface acoustic wave filter elements 81 and 82 to the respective output terminals 5 and 6. Reflectors are denoted by reference numerals 81d, 81e, 82d, and 82e.

The above-described first surface acoustic wave resonator 83 includes one IDT 83a and reflectors of the grating type (not shown) disposed on respective opposite sides of the IDT 83a.

In the first surface acoustic wave resonator 83, the interdigital overlapping length W of the electrode finger of the IDT 83a is preferably equal to about 20 λ, and the number N of pairs of electrode fingers is preferably equal to 80. The wavelength λI of the IDT is preferably equal to about 4.20 μm. The reflectors which are not shown in the figure have 120 electrode fingers.

The second and third surface acoustic wave resonators 84 and 85 connected to the output terminals 5 and 6 are preferably formed in a manner similar to the first surface acoustic wave resonator 83.

Figure 21:
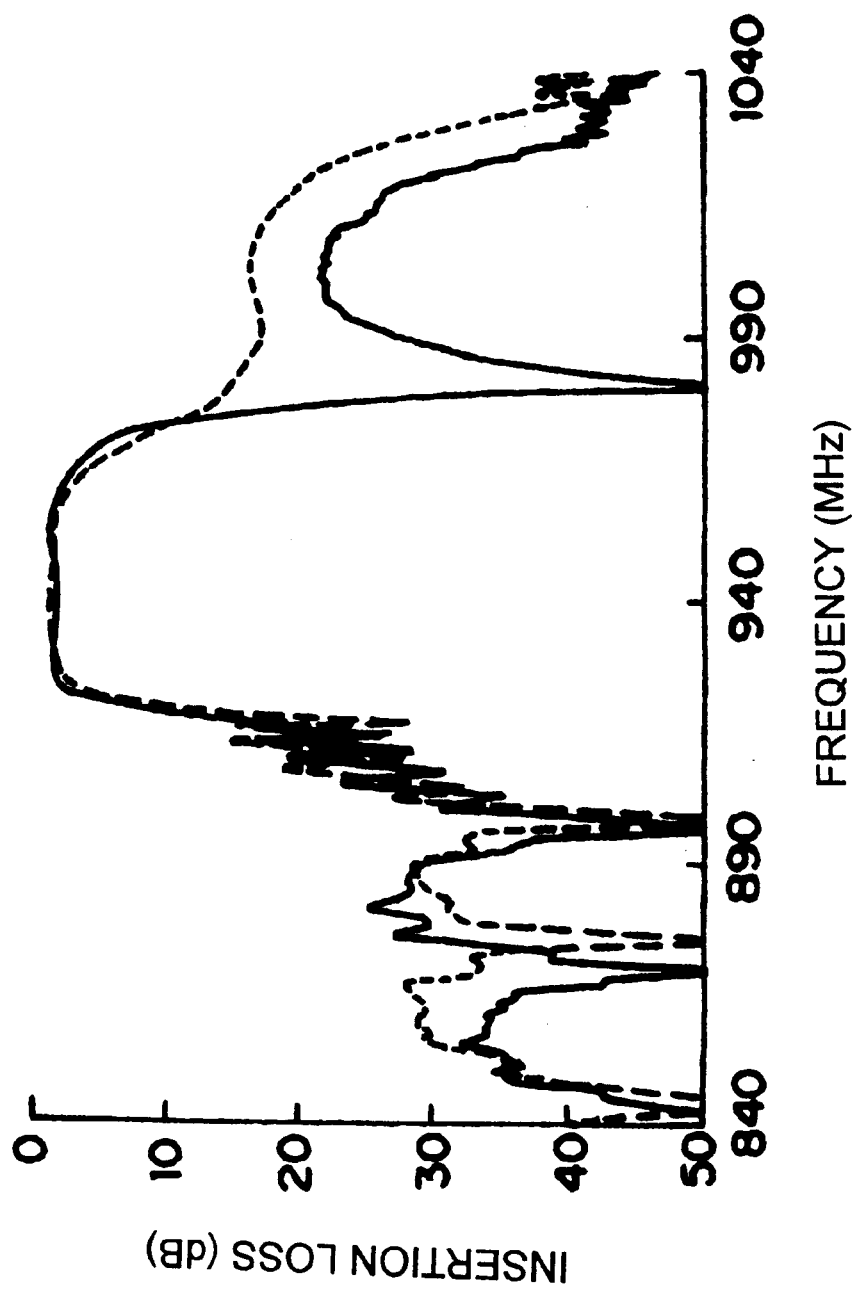
FIG. 21 is a graph illustrating the filter characteristic for both the surface acoustic wave filter device according to the fourth preferred embodiment and that according to the eighth preferred embodiment of the present invention.

In the present preferred embodiment, the first and third surface acoustic wave resonators 83 to 85 connected in the above-described manner result in a great increase in attenuation outside the passband compared with the fourth preferred embodiment, as shown in FIG. 21. In FIG. 21, the solid line represents the filter characteristic of the surface acoustic wave filter device of the eighth preferred embodiment, and the broken line represents the filter characteristic of the surface acoustic wave filter device of the fourth preferred embodiment.

Figure 22:
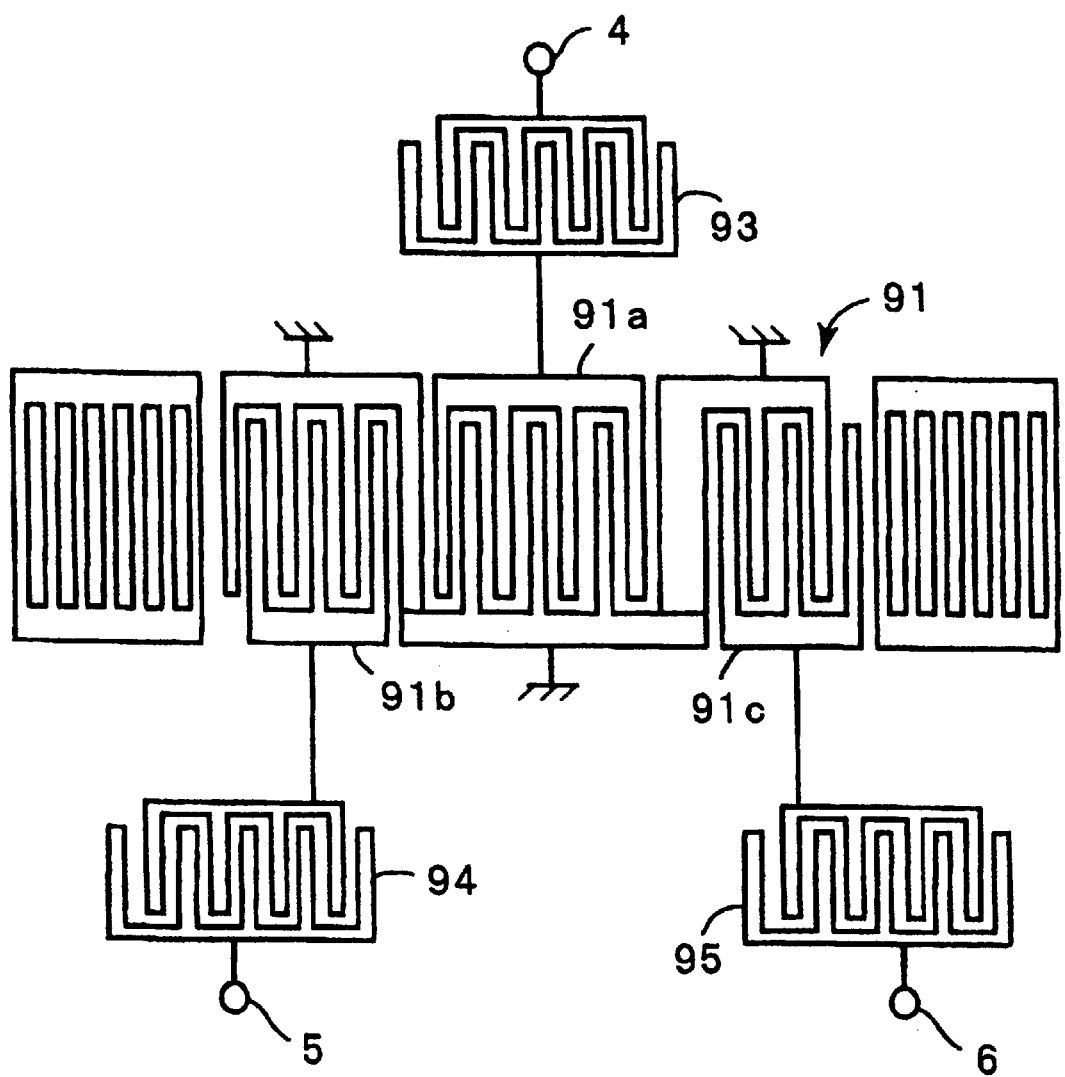
FIG. 22 is a plan view schematically illustrating the electrode structure of a surface acoustic wave filter device according to a ninth preferred embodiment of the present invention.

FIG. 22 is a plan view schematically illustrating the electrode structure of a surface acoustic wave filter device according to a ninth preferred embodiment. The surface acoustic wave filter device of this ninth preferred embodiment has a structure which is obtained by inserting first to third surface acoustic wave resonators 93 to 95 at the input and output sides of the surface acoustic wave filter device of the sixth preferred embodiment in a manner similar to the eighth preferred embodiment.

The surface acoustic wave filter element 91 is preferably formed in the same manner as the surface acoustic wave filter element 61 of the sixth preferred embodiment. The first surface acoustic wave resonator 93 connected between the input terminal 4 and the first IDT 91a at the central location and the second and third surface acoustic wave resonators 94 and 95 connected between the output terminals 5 and 6 and the second and third IDTs 91b and 91c are preferably formed in the same manner as the surface acoustic wave resonator 83 to 85 of the eighth preferred embodiment.

Also in the present preferred embodiment, as in the eighth preferred embodiment, the first and third surface acoustic wave resonators connected between the input terminal and the input end of the surface acoustic wave filter element or between the output terminal and the output end of the surface acoustic wave filter element result in an increase in attenuation near the edges of the passband, in particular, near the upper edge.

Figure 23:
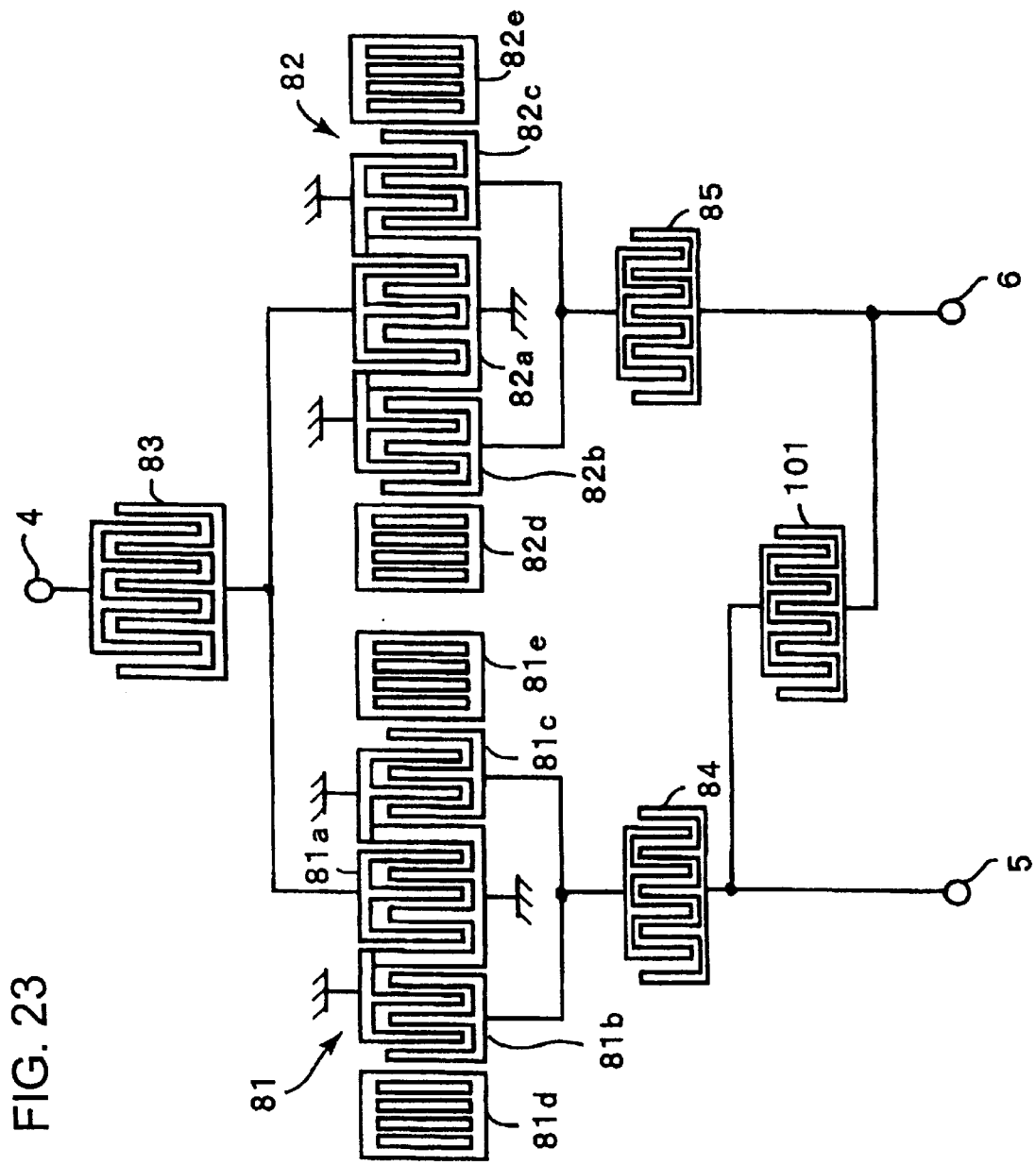
FIG. 23 is a plan view schematically illustrating the electrode structure of a surface acoustic wave filter device according to a tenth preferred embodiment of the present invention.

FIG. 23 is a plan view schematically illustrating the electrode structure of a surface acoustic wave filter device according to a tenth preferred embodiment. The surface acoustic wave filter device of the present preferred embodiment has a structure obtained by adding a fourth surface acoustic wave resonator 101 to the surface acoustic wave filter device of the eighth preferred embodiment such that the fourth surface acoustic wave resonator 101 is inserted between the second surface acoustic wave resonator 84 and the output terminal 6. In other words, the fourth surface acoustic wave resonator 101 is connected in parallel to the output terminals 5 and 6. The fourth surface acoustic wave resonator 101 includes one IDT and two grating-type reflectors disposed on the respective opposite sides of the IDT, although the grating-type reflectors are not shown in the figure. The fourth surface acoustic wave resonator 101 is arranged such that the interdigital overlapping length W of the electrode finger of the IDT is preferably equal to about 15 λ, the IDT has 50 pairs of electrode fingers, the wavelength λI of the IDT is preferably equal to about 4.40 μm, and the reflectors have 120 electrode fingers.

By adding the fourth surface acoustic wave resonator 101 to the surface acoustic wave filter device of the eighth preferred embodiment in the manner according to the present preferred embodiment, a ladder-type filter circuit is disposed on the side of the balanced output terminals 5 and 6. If this ladder-type filter circuit is arranged such that its attenuation poles are located near the lower and upper edges of the passband of the surface acoustic wave filter element 81, greater attenuation and better selectivity can be achieved.

Because the surface acoustic wave resonator 101 is connected in the form of a bridge between the balanced output terminals 5 and 6, the influences imposed upon the balanced terminals 5 and 6 are substantially equal, and thus factors which would otherwise cause degradation in the degree of balance are cancelled out. Therefore, the attenuation outside the passband can be increased without causing degradation in the degree of balance.

In the first to tenth preferred embodiments described above, surface acoustic wave filter devices have been described only in terms of the electrode structure disposed on the piezoelectric substrate. However, the surface acoustic wave filter device according to various preferred embodiments of the present invention can be constructed in the form of a chip-type surface acoustic wave filter device by using various package structures.

Figure 24A:
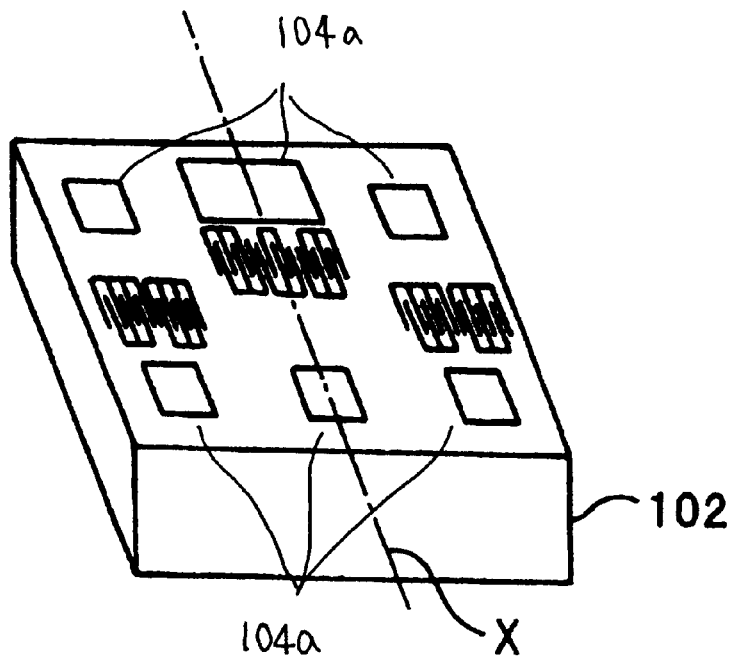
FIG. 24A is a perspective exploded view illustrating a surface acoustic wave filter device according to an eleventh preferred embodiment of the present invention.
Figure 24A:
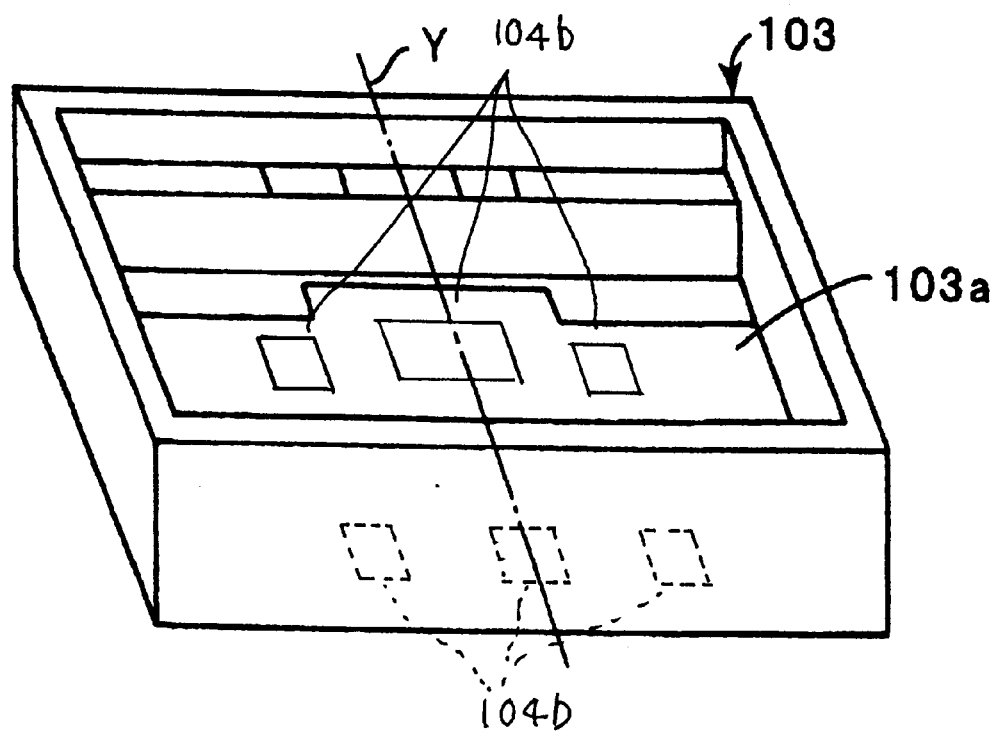

In an eleventh preferred embodiment described below, a surface acoustic wave filter device is provided in the form of a component housed in a package. A surface acoustic wave filter element is obtained by disposed electrodes on a piezoelectric substrate 102 according to preferred embodiments of the present invention, as shown in FIG. 24A. The surface acoustic wave filter element is housed in a package 103 having a cavity 103a.

In the present preferred embodiment, the piezoelectric substrate 102 used to produce the surface acoustic wave filter element preferably has a substantially rectangular plate shape, and a plurality of IDTs and plurality of electrode pads 104a for input, output and ground are arranged symmetrically with respect to an axis X passing through the center of the piezoelectric substrate 102.

The package 103 also preferably has a substantially rectangular shape in plan view and has a symmetry axis Y passing through the center. A plurality of electrodes pads 104b are provided on an inner bottom surface of the cavity 103a and arranged symmetrically with respect to an axis Y. The electrode pads 104a on the piezoelectric substrate 102 and the electrode pads 104b on the inner bottom of the cavity 103a of the package 103 are bonded by flip chip bonding so that the surface acoustic wave filter provided on the piezoelectric substrate 102 is bonded on the bottom of the cavity 103 in a face-down manner and fixed to the package with the axis X and axis Y coincide.

Alternately, the piezoelectric substrate 102 may be firmly placed in the package 103 face-up such that the symmetry axis X of the piezoelectric substrate 102 and the symmetry axis Y of the package 103 become coincident with each other. In the case, although not shown in FIG. 24A, the surface acoustic wave filter element is connected to electrode pads provided on the package 103 via bonding wires. The electrode pads and the bonding wires are also disposed in an axially symmetric fashion with respect to the symmetry axis X or Y.

As a result of the coincidence between the symmetry axis X of the piezoelectric substrate 102 and the symmetry axis Y of the package 103, interconnection lines which are disposed on the surface acoustic wave filter and which are connected to the respective balanced output terminals become substantially equal in terms of the electrical length and parasitic capacitance. Therefore, degradation in the degree of balance is suppressed.

Furthermore, because the package has the axially symmetric structure with respect to the symmetry axis Y passing through the center of the package, the electrical length and parasitic capacitance of interconnections which are disposed in the package and which are connected to the respective balanced terminals become equal for each balanced terminal. This also results in suppression of degradation in the degree of balance. Thus, factors which can cause degradation in the degree of balance can be reduced to very low levels, and a surface acoustic wave filter device which has a balance-unbalance conversion capability and which is excellent in terms of the degree of balance is obtained.

In the case where the electrical connections are made via flip-chip bonding instead of wire bonding, since no bonding wire is required, is it possible to symmetrically arrange the electric length and stray capacitance with respect to the electric connection between the piezoelectric substrate and package, thereby increasing the balance of the surface acoustic wave filter.

In the case where the wire bonding is used, the same effects can be obtained by disposing the electrode pads and the bonding wires at locations axially symmetric with respect to the symmetry axis X or Y as described above.

In the present embodiment, it is also advantageous that external terminals such as an external input terminal, external output terminals are arranged symmetrically on an outer bottom surface of a package.

Figure 24B:
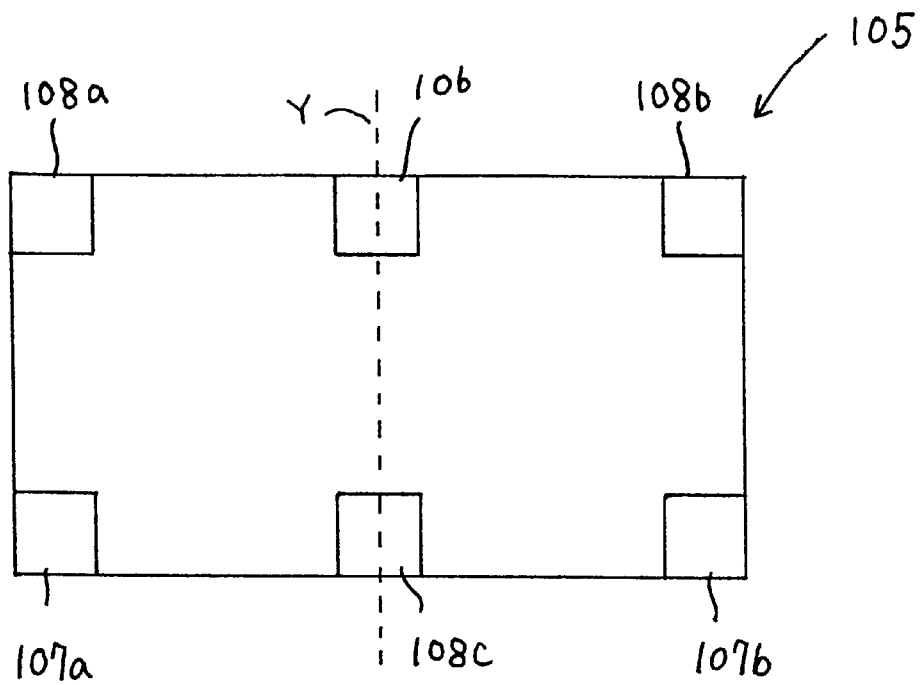
FIGS. 24B and 24C are plan views each showing a bottom surface of package in which surface acoustic wave filter according to various preferred embodiments of the present invention is provided.

As shown in FIG. 24B, a package 105 in which a surface acoustic wave filter according to a preferred embodiment of the present invention is placed has an external input terminal 106, external output terminals 107a and 107b and external grounded terminals 108a to 108c on the outer bottom surface of the package 105. The package 105 has a substantially rectangular bottom surface, and the external input terminal 106 is located on a symmetric axis Y of the package 105. The external output terminals 107a and 107b are disposed on the outer bottom surface of the package 105 so as to be located symmetrically with respect to the external input terminal 106 or the axis Y. The external grounded terminals 108a to 108c are also arranged symmetrically with respect to the symmetric axis Y. More specifically, the external grounded terminals 108a and 108b are located such that the external input terminal 106 is located at the middle point between the external grounded terminals 108a and 108b, and the external grounded terminal 108c is positioned on the symmetric axis Y.

These external terminals are electrically connected to the above-explained electrode pads provided on the inner bottom of the package, and the electrode pads are also connected to the terminals of the surface acoustic wave filter placed in the package 105 by flip-chip bonding or wire bonding.

For example, in the case where the surface acoustic wave filter is constructed according to the first preferred embodiment of the present invention shown in FIG. 1, the external input terminal 106 is electrically connected to the input terminal 4, and the external output terminals 107a and 107b are electrically connected to the output terminals 6 and 5, respectively. The external grounded terminal 108c is preferably connected to the IDTs 2a and 3a, and the external grounded terminals 108a and 108b are connected to the other IDTs to be grounded.

Figure 24C:
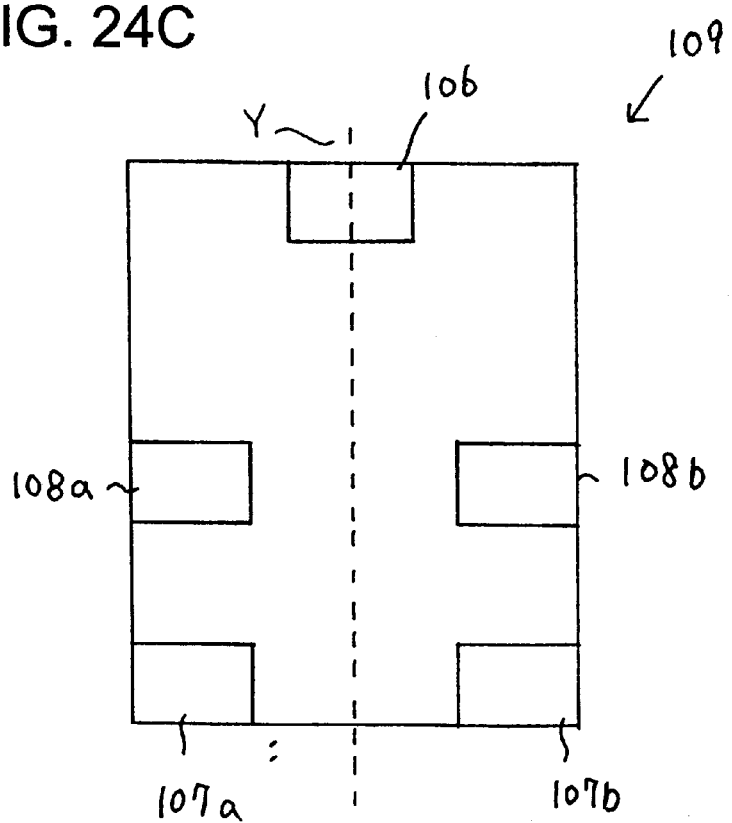

As shown in FIG. 24C, the external grounded terminals 108a and 108b may be placed between the external input terminal 106 and the external output terminals 107a and 107b, respectively.

According to the structure, since the two external output terminals are arranged symmetrically with respect to the external input terminal, the degree of balance is further improved. When the external grounded terminal is provided between the external output terminals, the degree of balance is still further improved. On the other hand, when the two external grounded terminals are provided between the external input terminal and the two external output terminals, it is possible to reduce the direct propagation signal component between the input terminal and the output terminals.

Figure 25:
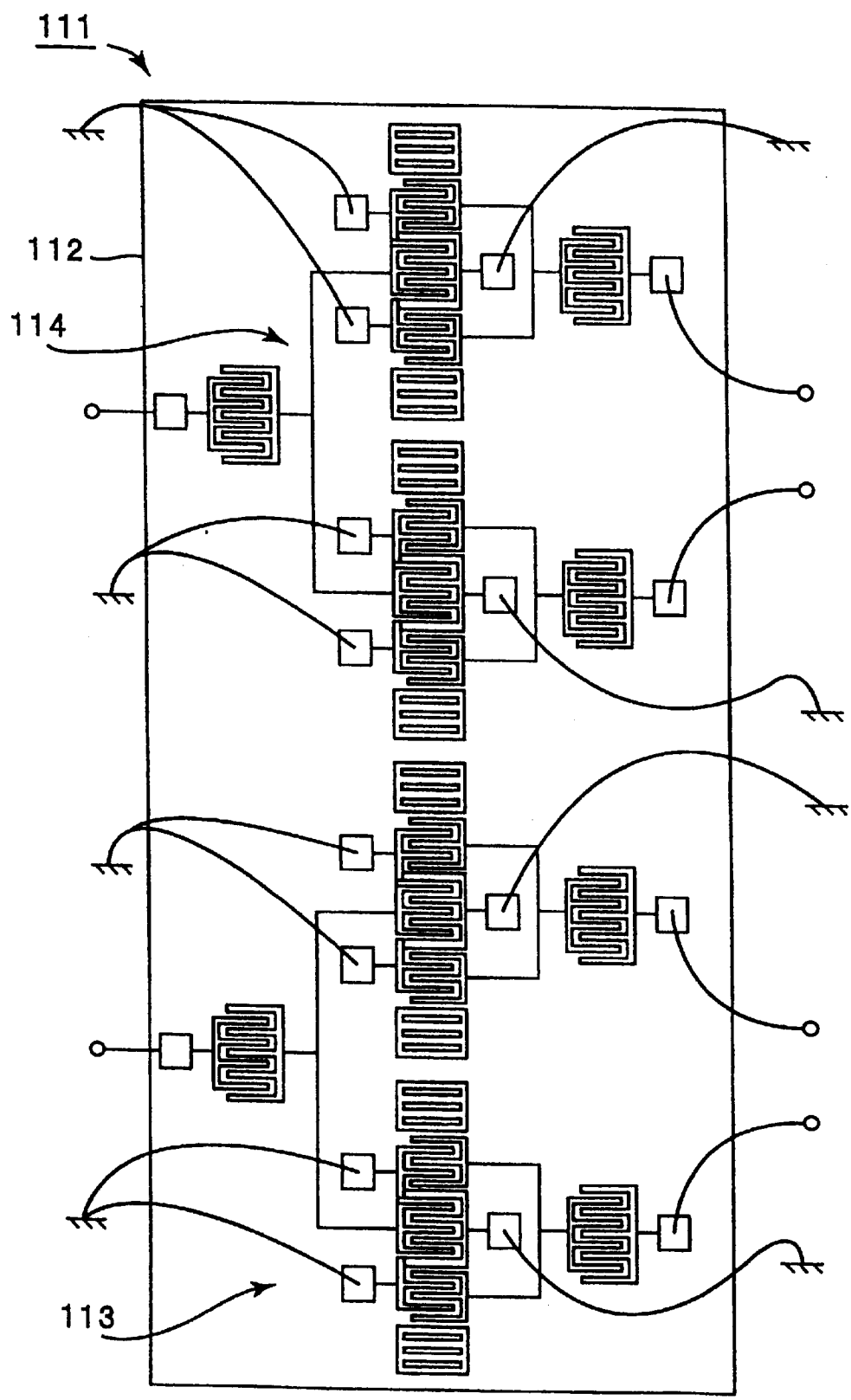
FIG. 25 is a plan view illustrating a surface acoustic wave filter device according to a twelfth preferred embodiment of the present invention.

FIG. 25 is a plan view schematically illustrating a twelfth preferred embodiment of a surface acoustic wave filter including unbalance-balance surface acoustic wave filters which are arranged on the same piezoelectric substrate so as to have different frequency characteristics. In this surface acoustic wave filter 111, surface acoustic wave filter devices 113 and 114 having the same structure as the surface acoustic wave filter device shown in FIG. 20 are disposed on the same piezoelectric substrate 112. For example, the surface acoustic wave filter device 113 may be a 900-MHz bandpass filter and the surface acoustic wave filter device 114 may be a 1900-MHz bandpass filter. The formation of two unbalance-balance surface acoustic wave filter devices 113 and 114 on the same piezoelectric substrate 112 results in a reduction in the size of the bandpass filter.

In FIG. 25, electrode pads disposed on the piezoelectric substrate are connected to an electrode pattern or a ground electrode pattern disposed on a package via bonding wires. However, instead of the wire bonding, another technique may also be used to achieve the electrical connections.

Figure 26:
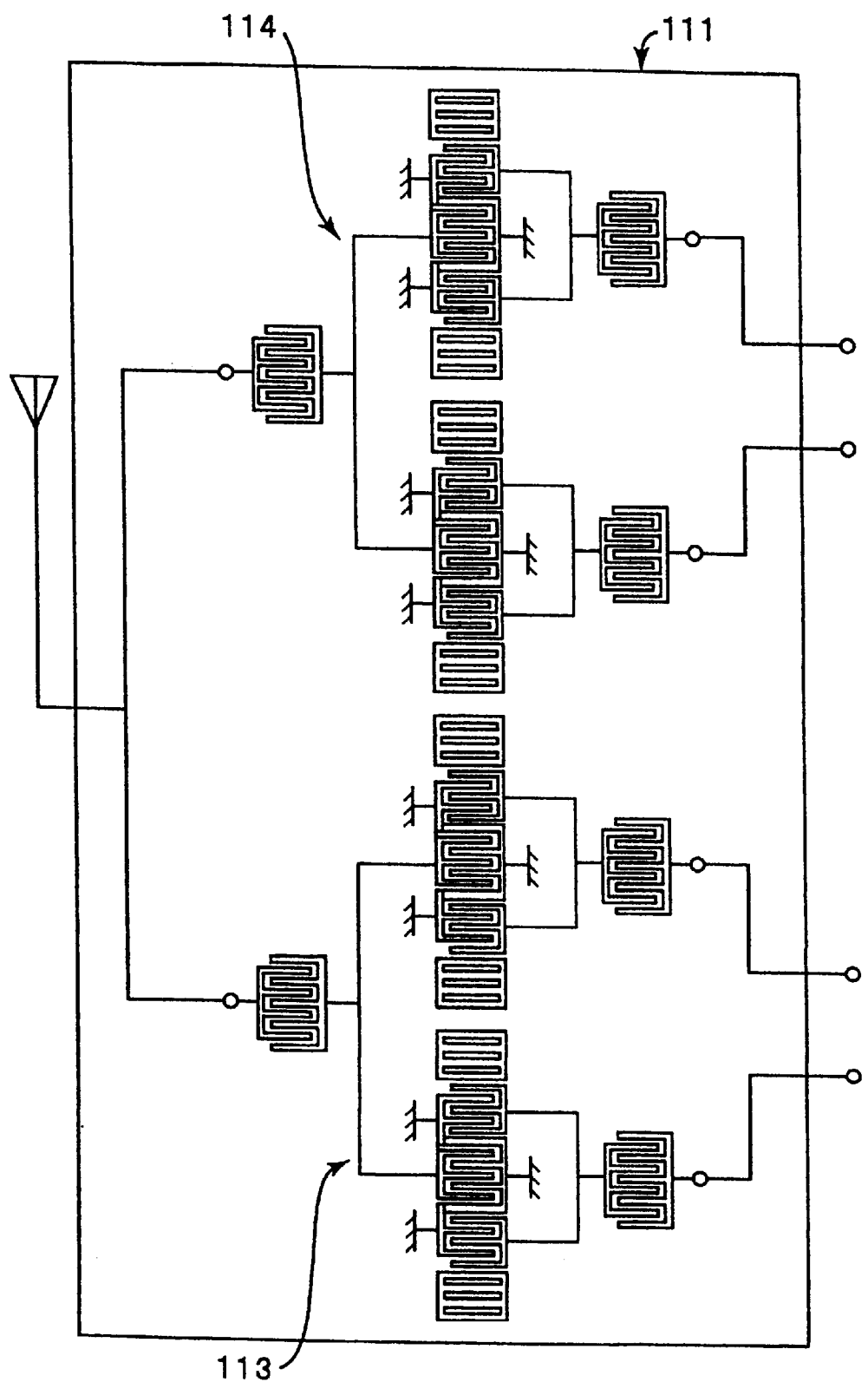
FIG. 26 is a schematic diagram illustrating an antenna duplexer constructed to incorporate a surface acoustic wave filter device according to the twelfth preferred embodiment of the present invention.

FIG. 26 is a schematic diagram illustrating an antenna duplexer using the surface acoustic wave filter device 111 shown in FIG. 25. In this antenna duplexer, the input ends of the surface acoustic wave filter devices 113 and 114 are connected in common to an antenna ANT. The output ends of the surface acoustic wave filter devices 113 and 114 functions as a transmission output end Tx and a reception output end Rx, respectively.

Figure 27:
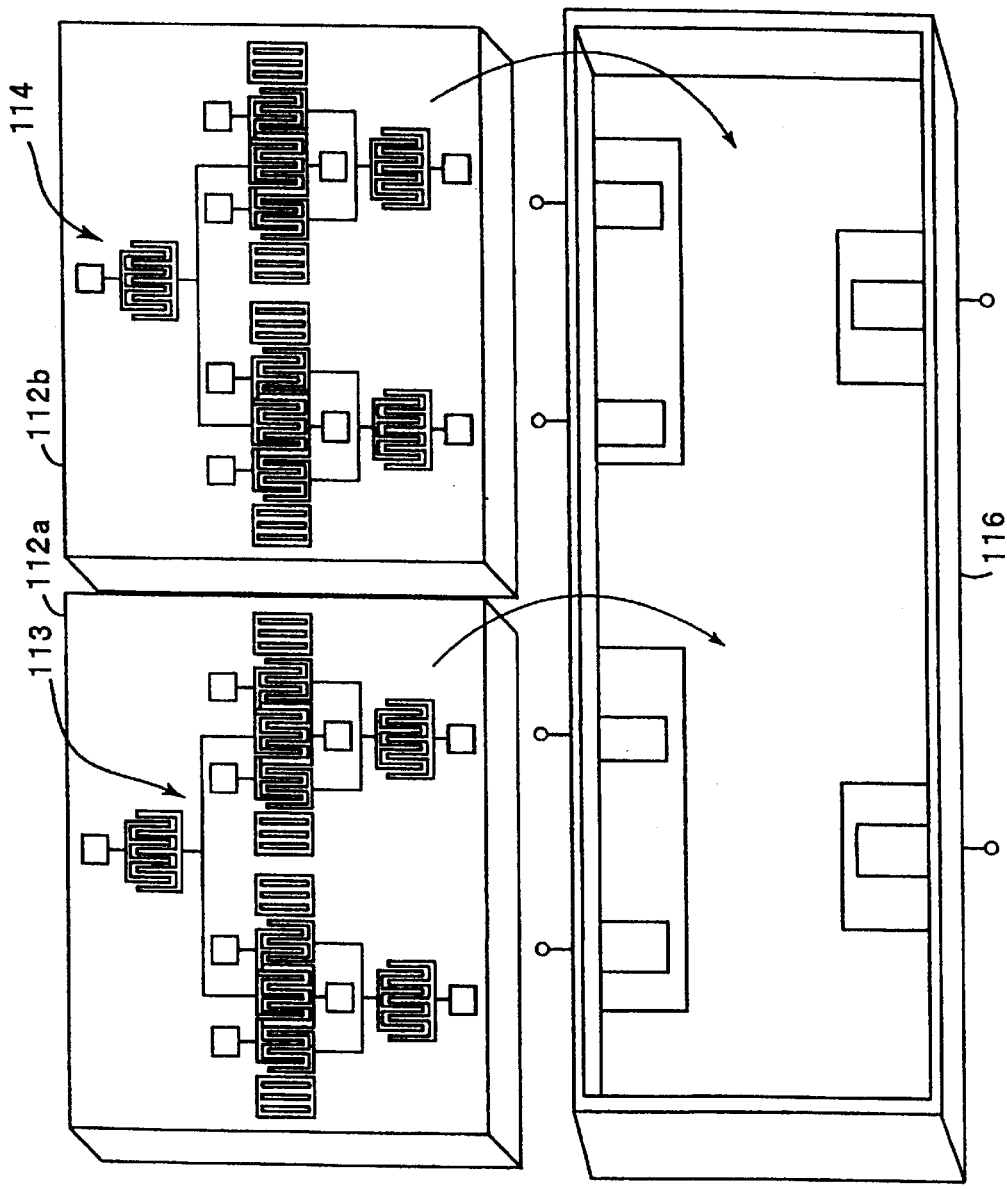
FIG. 27 is a schematic diagram illustrating a modification of the surface acoustic wave filter device according to the twelfth preferred embodiment of the present invention.
Figure 28:
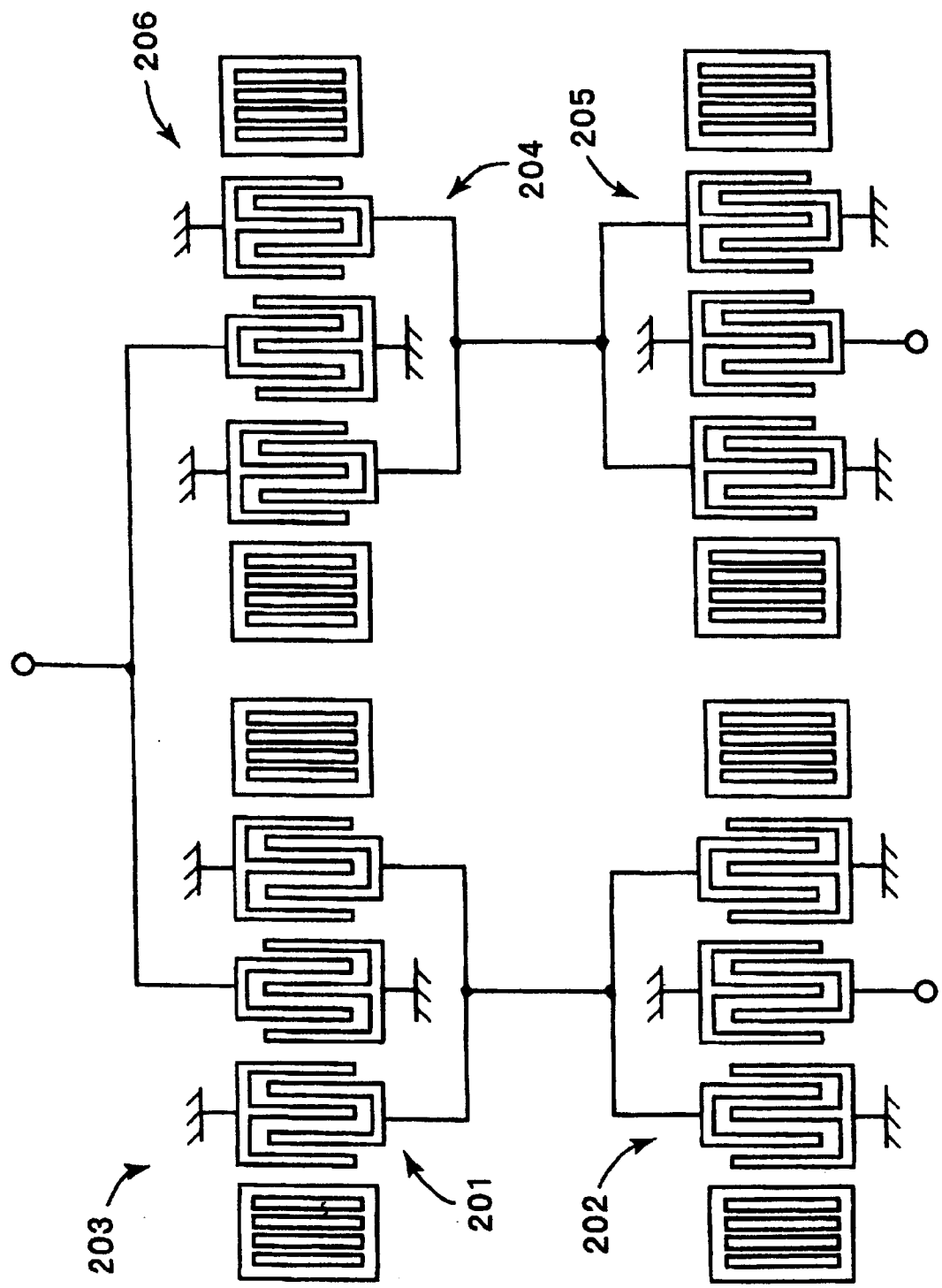
FIG. 28 is a plan view schematically illustrating an example of a conventional surface acoustic wave filter device.
Figure 29:
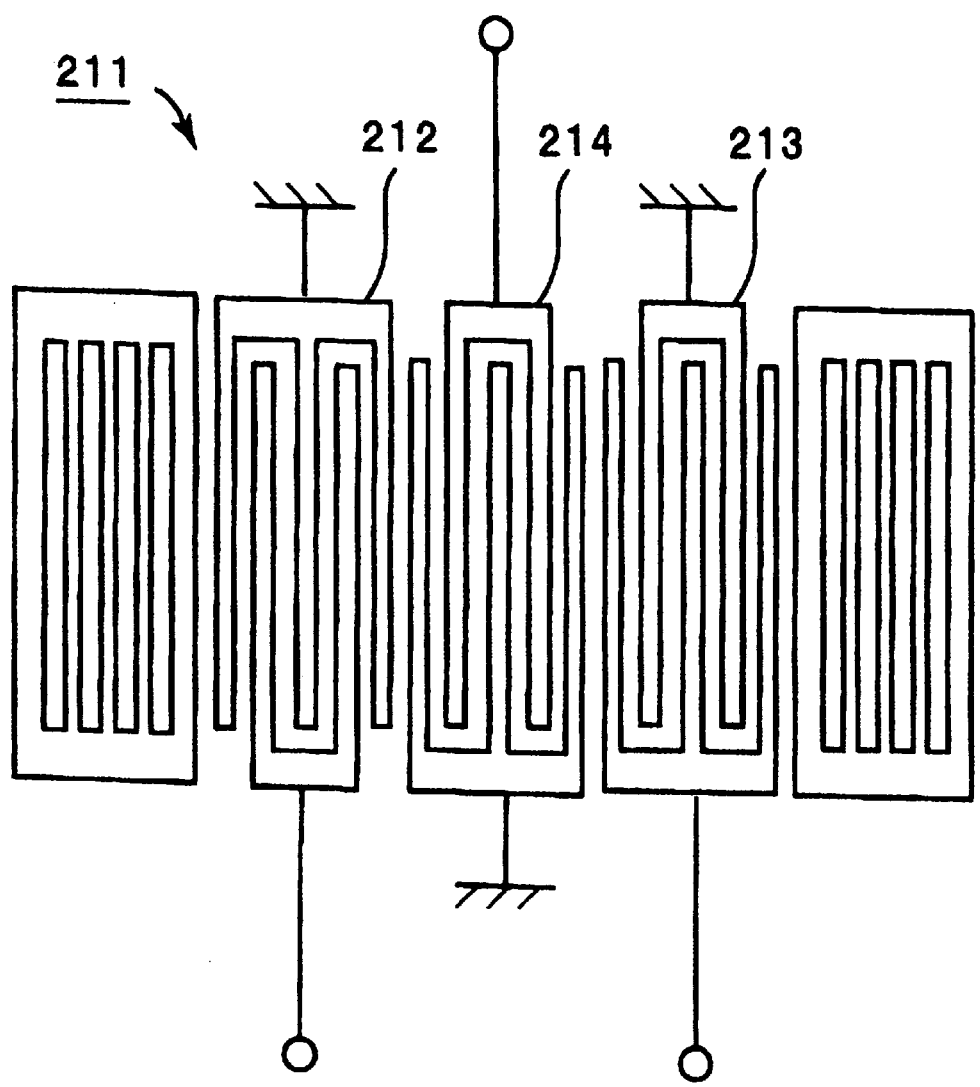
FIG. 29 is a plan view schematically illustrating another example of a conventional surface acoustic wave filter device.

In FIG. 25, filters having different frequency characteristics are disposed on the same piezoelectric substrate 112. Alternatively, surface acoustic wave filter devices 113 and 114 having different frequency characteristics may be disposed on different piezoelectric substrates 112a and 112b, as shown in FIG. 27. In this case, the surface acoustic wave filter devices 113 and 114 disposed on the different piezoelectric substrates 112a and 112b are housed in a package 116.

While preferred embodiments of the invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A surface acoustic wave filter device comprising:
   a piezoelectric substrate having an input side and an output side; and
   first, second and third surface acoustic wave filter elements disposed on said piezoelectric substrate; wherein
   the first surface acoustic wave filter element includes a first IDT arranged along a surface acoustic wave propagation direction and also includes second and third IDTs disposed on respective opposite sides, in the surface acoustic wave propagation direction, of the first IDT;
   said second and third surface acoustic wave filter elements each include a plurality of IDTs disposed along the surface acoustic wave propagation direction;

said second and third surface acoustic wave filter elements are arranged such that they are substantially equal in transmission amplitude characteristic within a band but different in transmission phase characteristic by about 180°; and the second IDT of the first surface acoustic wave filter element is connected to the second surface acoustic wave filter element, and the third IDT of the first surface acoustic wave filter element is connected to an IDT of the third surface acoustic wave filter element; wherein the input side includes only the first surface acoustic wave filter, and the output side includes the second and third surface acoustic wave filters.

2. A surface acoustic wave filter device according to claim 1, wherein a second space defined in the third surface acoustic wave filter element between one of the IDTs connected to the first surface acoustic wave filter element and an one of the IDTs connected to an output terminal is different by about 0.48λ to about 0.525λ from a first space defined in the second surface acoustic wave filter element between one of the IDTs connected to the first surface acoustic wave filter element and another one of the IDTs connected to an output terminal, where λ is the wavelength of the surface acoustic wave.

3. A surface acoustic wave filter device according to claim 2, further comprising:

first and second reflectors disposed on respective opposite sides in the surface acoustic wave propagation direction of the area in which said plurality of IDTs of the second surface acoustic wave filter element are disposed; and third and fourth reflectors disposed on respective opposite sides in the surface acoustic wave propagation direction of the area in which said plurality of IDTs of the third surface acoustic wave filter element are disposed, wherein the distance between the first reflector and the second reflector is substantially equal to the distance between the third reflector and the fourth reflector.

4. A surface acoustic wave filter device according to claim 2, wherein said first space is equal to about$(n/2+1.22)\times\lambda$ to about $(n/2+1.33)\times\lambda$ (n is an integer of 0 to 4), and said second space is equal to about $(n/2+1.72)\times\lambda$ to about $(n/2+1.83)\times\lambda$ (n is an integer of 0 to 4).

5. A surface acoustic wave filter device according to claim 4, wherein said first space is equal to about $(n/2+1.22)\times\lambda$ to about $(n/2+1.33)\times\lambda$ (n is an integer of 0 to 2), and said second space is equal to $(n/2+1.72)\times\lambda$ to about $(n/2+1.83)\times\lambda$ (n is an integer of 0 to 2).

6. A surface acoustic wave filter device according to claim 2, wherein said first space is within the range from about 1.72λ to about 1.83λ and said second space is within the range from about 2.22λ to about 2.33λ.

7. A surface acoustic wave filter device according to claim 2, wherein said piezoelectric substrate is a $LiTaO_3$ substrate made of a $LiTaO_3$ single crystal with an orientation rotated about the X axis from the Y axis to the Z axis within the range from about 36° to about 44°, and at least one electrode finger is inserted in at least one of the first and second spaces in the second and third respective surface acoustic wave filter elements so that the electrode covering ratio of the space in which said electrode finger is inserted becomes equal to or greater than about 50%.

8. A surface acoustic wave filter device according to claim 7, wherein said electrode covering ratio is equal to or greater than about 63%.

9. A surface acoustic wave filter device comprising:

a piezoelectric substrate; and first, second and third surface acoustic wave filter elements disposed on said piezoelectric substrate, each of said surface acoustic wave filters having a plurality of IDTs arranged along a surface acoustic wave propagation direction;

wherein said second and third surface acoustic wave filter elements are arranged such that they are substantially equal in transmission amplitude characteristic within a band but different in transmission phase characteristic by about 180°; and at least one IDT of the second surface acoustic wave filter element is connected to only one IDT of the first surface acoustic wave filter element, and at least one IDT of the third surface acoustic wave filter element is connected to only one IDT of the first surface acoustic wave filter element.

10. A surface acoustic wave filter device according to claim 9, further comprising a ladder-type surface acoustic wave filter connected in a cascade fashion on a balanced terminal side adjacent to the second and third surface acoustic wave filter elements.

11. A surface acoustic wave filter device according to claim 7, further comprising a package which has a cavity for housing a chip including the piezoelectric substrate on which the surface acoustic wave filter elements are disposed, said package having on an inner bottom of the cavity electrodes pads to be electrically connected to electrode patterns on the chip, wherein at least one of the electrode pattern disposed on the piezoelectric substrate, the package, or the electrode pads has a substantially axially symmetric structure.

12. A surface acoustic wave filter device according to claim 11, wherein at least two of the electrode pattern, the package, and the electrode pads have structures which are substantially axially symmetric with respect to the same symmetry axis.

13. A surface acoustic wave filter device according to claim 9, further comprising a package which has a cavity for housing a chip including the piezoelectric substrate on which the surface acoustic wave filter elements are disposed, said package having on an outer bottom of the cavity an external input terminal and two external output terminals, such that the two external output terminals are symmetric with respect to said external input terminal.

14. A surface acoustic wave filter device according to claim 13, further comprising an external grounded terminal provided between said two external output terminals.

15. A surface acoustic wave filter device according to claim 13, further comprising two external grounded terminals provided between said external input terminal and said two external output terminals, respectively.

16. A duplexer comprising a surface acoustic wave filter according to claim 9.

17. A communication device comprising a duplexer according to claim 16.

18. A surface acoustic wave filter device according to claim 9, wherein the interdigital overlapping length of the electrode finger of the IDTs of the first surface acoustic wave filter element is within the range of about 1.5 to about 3.5 times the interdigital overlapping length of the electrode finger of the IDTs of the second and third surface acoustic wave filter elements.

* * * * *